(12) United States Patent
Yoo et al.

(10) Patent No.: US 10,186,505 B2
(45) Date of Patent: Jan. 22, 2019

(54) ELECTROSTATIC DISCHARGE PROTECTION DEVICE

(71) Applicant: Samsung Electronics Co., Ltd., Suwon-si, Gyeonggi-do (KR)

(72) Inventors: Jae-Hyun Yoo, Hwaseong-si (KR); Jin-Tae Kim, Daejeon (KR); Jong-Sung Jeon, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 25 days.

(21) Appl. No.: 15/603,969

(22) Filed: May 24, 2017

(65) Prior Publication Data

US 2017/0256533 A1 Sep. 7, 2017

Related U.S. Application Data

(63) Continuation of application No. 14/509,365, filed on Oct. 8, 2014, now Pat. No. 9,679,886.

(30) Foreign Application Priority Data

Oct. 11, 2013 (KR) .................. 10-2013-0121546

(51) Int. Cl.
*H01L 27/02* (2006.01)
*H01L 27/06* (2006.01)

(52) U.S. Cl.
CPC ...... *H01L 27/0266* (2013.01); *H01L 27/0248* (2013.01); *H01L 27/0629* (2013.01); *H01L 27/0285* (2013.01); *H01L 27/0288* (2013.01)

(58) Field of Classification Search
CPC ............. H01L 27/0248; H01L 27/0629; H01L 27/0266; H01L 27/0285; H01L 27/0288
See application file for complete search history.

(56) References Cited

U.S. PATENT DOCUMENTS

| | | | | |
|---|---|---|---|---|
| 3,402,331 A | * | 9/1968 | Rittner | .................... H01L 25/16 257/66 |
| 4,746,961 A | * | 5/1988 | Konishi | ................ G02F 1/1368 257/61 |
| 5,326,714 A | * | 7/1994 | Liu | .................... H01L 27/10852 257/E21.648 |

(Continued)

FOREIGN PATENT DOCUMENTS

| | | |
|---|---|---|
| JP | 57015459 | 1/1982 |
| JP | 57015459 A * | 1/1982 |

(Continued)

*Primary Examiner* — Ermias Woldegeorgis
(74) *Attorney, Agent, or Firm* — Harness, Dickey & Pierce, P.L.C.

(57) ABSTRACT

An electrostatic discharge (ESD) protection device includes a substrate including a plurality of fins extending in a first direction, with an insulation layer on the fins. A gate electrode extending in a second direction, an electrode pattern of a capacitor, and a resistor are on the insulation layer. A drain is on a first side of the gate electrode, and a source is on a second side of the gate electrode. A connection structure electrically connects the electrode pattern, the gate electrode and the resistor. The electrode pattern is on the first side or the second side of the gate electrode, and the resistor is on the other of the first side or the second side. At least a portion of the resistor extends in the second direction.

19 Claims, 17 Drawing Sheets

(56) References Cited

U.S. PATENT DOCUMENTS

| | | |
|---|---|---|
| 7,288,820 B2 | 10/2007 | Baird et al. |
| 7,355,252 B2 | 4/2008 | Kim et al. |
| 7,456,478 B2 | 11/2008 | Tsutsumi |
| 7,485,931 B2 | 2/2009 | Nagatomo |
| 7,804,669 B2 | 9/2010 | Worley |
| 7,838,941 B2 | 11/2010 | Kwak |
| 7,929,262 B1 | 4/2011 | Vashchenko et al. |
| 8,247,872 B2 | 8/2012 | Son |
| 2002/0142540 A1* | 10/2002 | Katayama ............... H01L 28/60 |
| | | 438/239 |
| 2009/0195951 A1 | 8/2009 | Sorgeloos et al. |
| 2011/0079847 A1 | 4/2011 | Ebihara et al. |
| 2013/0200448 A1* | 8/2013 | Yen .................... H01L 23/5228 |
| | | 257/296 |

FOREIGN PATENT DOCUMENTS

| | | |
|---|---|---|
| KR | 100664377 B1 | 1/2007 |
| KR | 100942701 B1 | 2/2010 |
| KR | 20100089519 A | 8/2010 |

\* cited by examiner

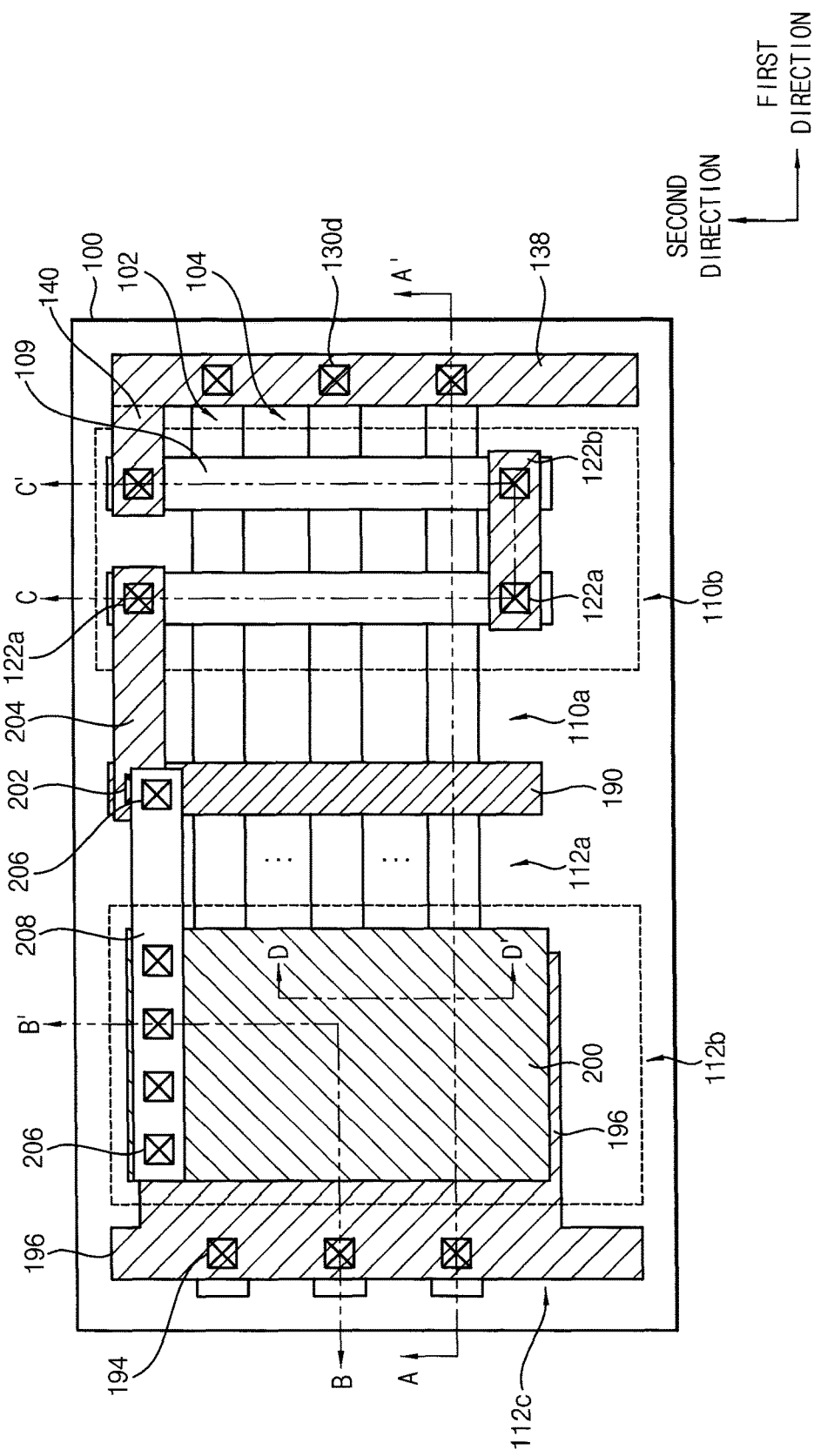

ELECTROSTATIC DISCHARGE PROTECTION DEVICE

CROSS-REFERENCE TO RELATED APPLICATION

This application is a continuation of U.S. application Ser. No. 14/509,365, filed Oct. 8, 2017 and claims priority under 35 USC § 119 to Korean Patent Application No. 10-2013-0121546, filed on Oct. 11, 2013 in the Korean Intellectual Property Office (KIPO), the contents of all of which are herein incorporated by reference in their entirety.

BACKGROUND

1. Field

At least one example embodiment relates to electrostatic discharge (ESD) protection devices, and more particularly, to ESD protection devices used for input/output (I/O) terminals of a semiconductor device.

2. Description of the Related Art

At input/output (I/O) terminals of a semiconductor device, an electrostatic discharge (ESD) protection device may be provided for protecting the semiconductor device. A conventional ESD protection device may include a plurality of unit devices for clamping excess voltages at the I/O terminals, which may occupy a large horizontal area. Thus, forming the ESD protection device having a narrow horizontal area is desired.

SUMMARY

At least one example embodiment provides an ESD protection device that may be formed in a narrow horizontal area.

At least one example embodiment provides an electrostatic discharge (ESD) protection device including a substrate including a plurality of active fins and a plurality of grooves, each of the active fins and each of the grooves extending in a first direction. The ESD protection device may include an insulation layer on the active fins and the grooves and a gate electrode on the active fins. The gate electrode may extend in a second direction substantially perpendicular to the first direction. The ESD protection device may include a first impurity region adjacent to a first side of the gate electrode, the first impurity region being spaced apart from the gate electrode in the first direction. The ESD protection device may include a second impurity region adjacent to a second side of the gate electrode, the second impurity region being spaced apart from the gate electrode in the first direction. The second side of the gate electrode may be arranged opposite to the first side in the first direction. The ESD protection device may include an electrode pattern of a capacitor overlapping the first impurity region and a resistor overlapping the second impurity region. The ESD protection device may include a connection structure electrically connecting the electrode pattern, the gate electrode, and the resistor to each other.

According to at least one example embodiment, the first impurity region has an area greater than that of the second impurity region.

According to at least one example embodiment, the electrode pattern of the capacitor covers at least half of a top surface of the first impurity extension region.

According to at least one example embodiment, a bottom surface of the electrode pattern of the capacitor has protrusion and groove portions corresponding to the active fins and the grooves of the substrate.

According to at least one example embodiment, the ESD protection device further includes a third impurity region adjacent to the first impurity region. The third impurity region may have a greater concentration of impurities than the first impurity region. The ESD protection device may include a fourth impurity region adjacent to the second impurity region. The fourth impurity region may have a greater concentration of impurities than the second impurity region.

According to at least one example embodiment, the ESD protection device includes a first wiring connected to the third impurity region, and a second wiring connected to the fourth impurity region.

According to at least one example embodiment, the electrode pattern of the capacitor is located on the substrate between the first wiring and the gate electrode, and the resistor is located on the substrate between the second wiring and the gate electrode.

According to at least one example embodiment, the ESD protection device includes a fifth impurity region on the substrate between the first impurity region and the gate electrode. The fifth impurity region may have a greater concentration of impurities than the first impurity region. The third impurity region and the fifth impurity region may be arranged on opposite sides of the first impurity region. The ESD protection device may include a sixth impurity region on the substrate between the second impurity region and the gate electrode. The sixth impurity region may have a greater concentration of impurities than the second impurity region. The fourth impurity region and the sixth impurity region may be arranged on opposite sides of the second impurity region.

According to at least one example embodiment, the gate electrode and the electrode pattern of the capacitor are formed of substantially the same material, and the resistor includes doped polysilicon.

According to at least one example embodiment, the gate electrode, the electrode pattern of the capacitor, and the resistor include doped polysilicon.

According to at least one example embodiment, top surfaces of the gate electrode, the electrode pattern of the capacitor, and the resistor are coplanar with each other.

According to at least one example embodiment, the resistor includes a plurality of resistance line patterns extending in the second direction and being parallel to each other, a plurality of contact plugs at end portions of the resistance line patterns, and a connection line electrically connecting the contact plugs that are adjacent to each other in the first direction.

According to at least one example embodiment, the connection structure is integrally formed with the electrode pattern and the gate electrode.

According to at least one example embodiment, the connection structure is integrally formed with the electrode pattern, the gate electrode, and at least a portion of the resistor.

According to at least one example embodiment, the connection structure includes contact plugs contacting the electrode pattern, the gate electrode and the resistor. The connection structure also includes connection lines contacting top surfaces of the contact plugs.

According to at least one example embodiment, a device includes a substrate, a transistor structure on the substrate, a capacitive structure on the substrate, and a resistive structure on the substrate. The transistor structure may include a source region, a drain region, and a gate region between the source region and the drain region. The gate region may include a gate electrode on an insulating layer. The capacitive structure may include an electrode pattern aligned with the drain region. The resistive structure may be aligned with the source region. The device may also include a connection structure electrically connecting the transistor structure, the capacitive structure, and the resistive structure to one another.

According to at least one example embodiment, each of the drain region and the source region includes a first impurity region between a second impurity region and a third impurity region. The first impurity region may have a lower impurity concentration than the second impurity region and the third impurity region.

According to at least one example embodiment, the capacitive structure further includes the first impurity region of the drain region and the insulating layer. The electrode pattern may be aligned with the first impurity region of the drain region.

According to at least one example embodiment, the resistive structure includes one or more line patterns aligned with the first impurity region of the source region.

According to at least one example embodiment, top surfaces of the electrode pattern, the one or more line patterns, and the gate electrode are coplanar with one another and are formed of a substantially same material.

BRIEF DESCRIPTION OF THE DRAWINGS

Example embodiments will be more clearly understood from the following detailed description taken in conjunction with the accompanying drawings. FIGS. 1 to 18C represent non-limiting, example embodiments as described herein.

FIG. 1 is a circuit diagram illustrating a ESD protection device in accordance with at least one example embodiment;

FIG. 2 is a top view illustrating the ESD protection device in accordance with at least one example embodiment;

FIGS. 4 to 8 are cross-sectional views illustrating stages of a method of manufacturing the ESD protection device in FIG. 2;

FIG. 9 is a top view illustrating a ESD protection device in accordance with at least one example embodiment;

FIG. 10 is a cross-sectional view of the ESD protection device cut along a line B-B' in FIG. 9;

FIG. 11 is a top view illustrating a ESD protection device in accordance with at least one example embodiment;

FIG. 12 is a cross-sectional view of the ESD protection device cut along a line C-C' in FIG. 11;

FIG. 13 is a top view illustrating a ESD protection device in accordance with at least one example embodiment;

FIG. 14 is a cross-sectional view of the ESD protection device cut along a line C-C' in FIG. 13;

FIG. 15 is a top view illustrating a ESD protection device in accordance with at least one example embodiment;

FIG. 16 is a cross-sectional view of the ESD protection device cut along a line A-A' in FIG. 15;

FIG. 17 is a top view illustrating a ESD protection device in accordance with at least one example embodiment;

FIG. 18C is a cross-sectional view of the ESD protection device cut along a line C-C' in FIG. 17.

DESCRIPTION OF EXAMPLE EMBODIMENTS

Figure 1:
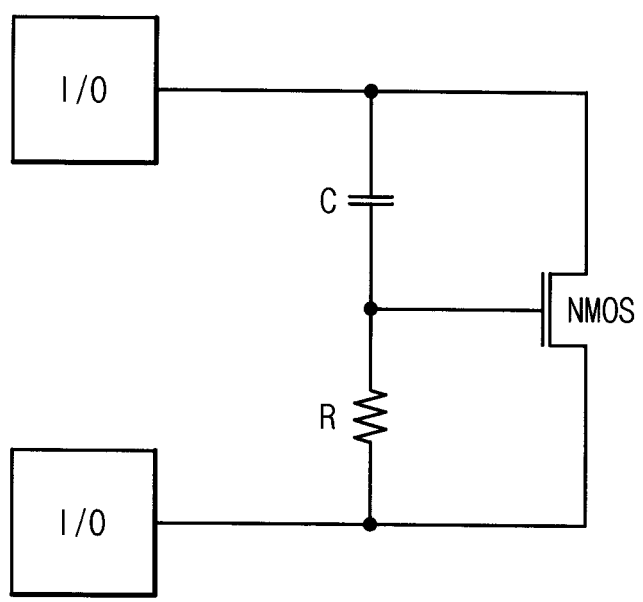

Various example embodiments will be described more fully hereinafter with reference to the accompanying drawings, in which some example embodiments are shown. The inventive concepts may, however, be embodied in many different forms and should not be construed as limited to the example embodiments set forth herein. Rather, these example embodiments are provided so that this description will be thorough and complete, and will fully convey the scope of the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concepts. As used herein, the singular forms "a," "an" and "the" are intended to include the plural forms as well, unless the context clearly indicates otherwise. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
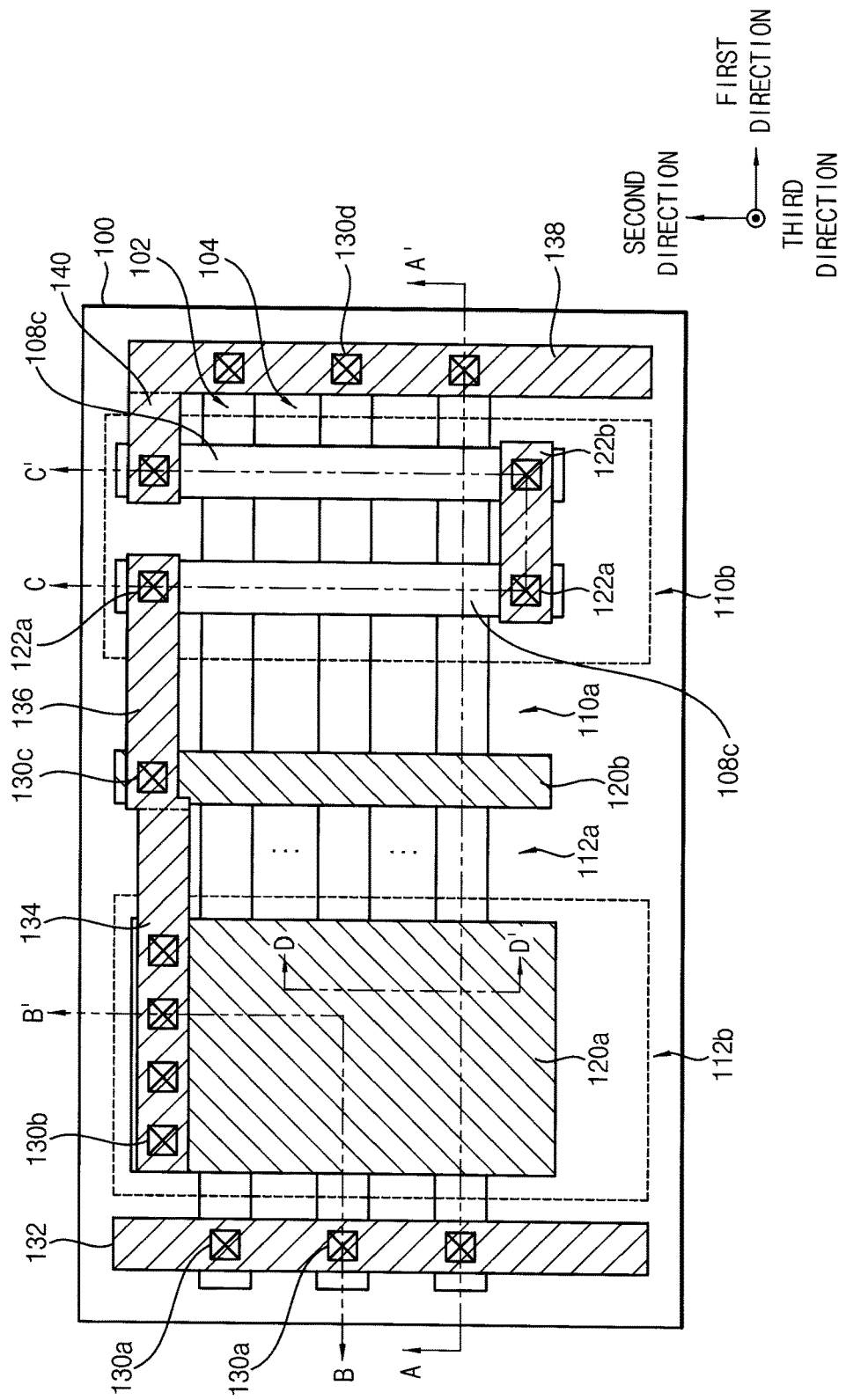
Figure 3A:
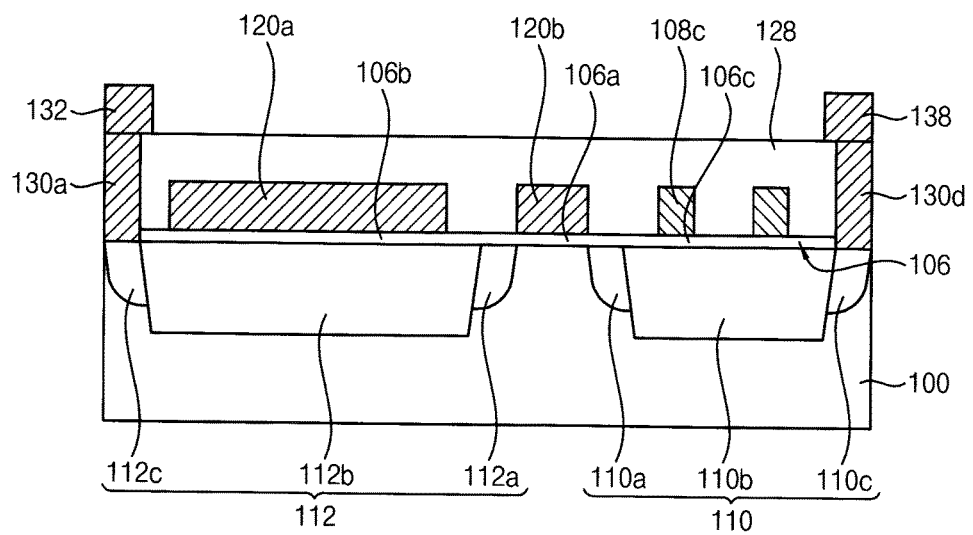
FIG. 3A is a cross-sectional view of the ESD protection device cut along a line A-A' in FIG. 2.
Figure 3B:
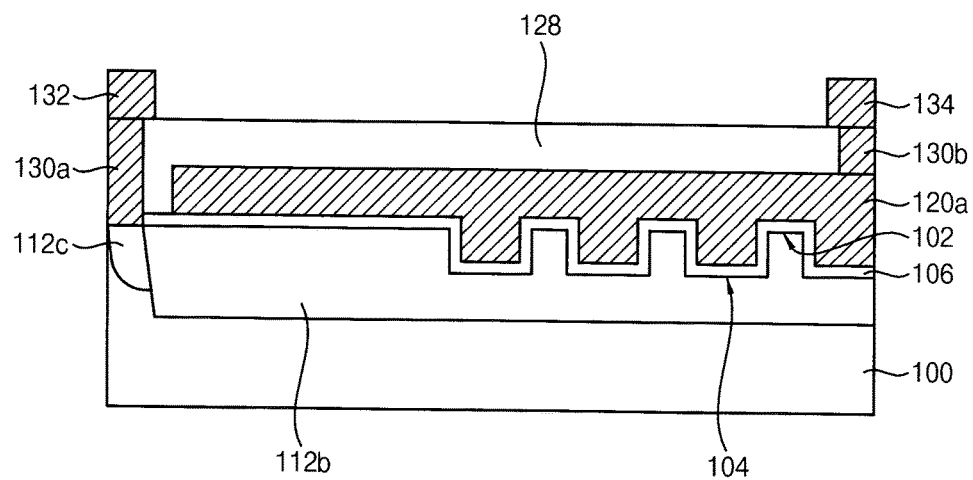
FIG. 3B is a cross-sectional view of the ESD protection device cut along a line B-B' in FIG. 2.
Figure 3C:
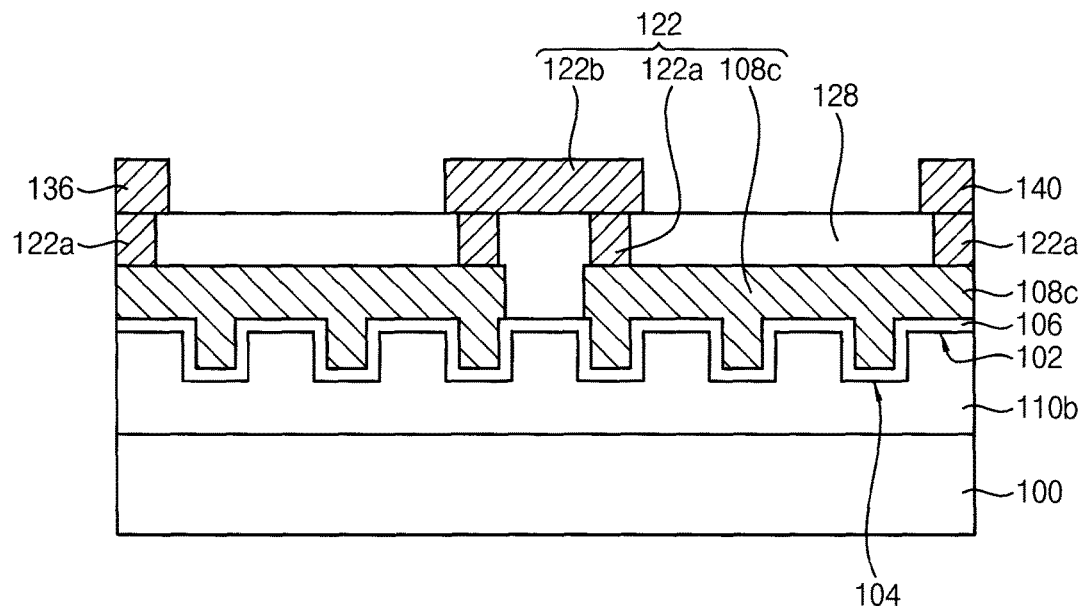
FIG. 3C is a cross-sectional view of the ESD protection device cut along a line C-C' in FIG. 2.

FIG. 1 is a circuit diagram illustrating an electrostatic discharge (ESD) protection device in accordance with at least one example embodiment. FIG. 2 is a top view illustrating the ESD protection device in accordance with at least one example embodiment. FIG. 3A is a cross-sectional view of the ESD protection device cut along a line A-A' in FIG. 2. FIG. 3B is a cross-sectional view of the ESD protection device cut along a line B-B' in FIG. 2. FIG. 3C is a cross-sectional view of the ESD protection device cut along a line C-C' in FIG. 2.

Referring to FIG. 1, the ESD protection device for clamping excess voltage at input/output (I/O) terminals may use a gate coupled NMOS (negative-channel metal oxide semiconductor) (GCNMOS) transistor in which a capacitor C and a resistor R are connected to each other.

The resistor R may be disposed between a gate and a source of the NMOS transistor. The capacitor C may be disposed between the gate and a drain of the NMOS transistor. When an ESD occurs so that a high voltage is applied to the I/O terminals, a high voltage applied to the drain may be applied to the gate by the capacitor C, and a current through the resistor R may cause a gate-source voltage. The gate-source voltage may form a channel in the NMOS transistor, and thus a large amount of current may flow from the drain. Therefore, the high voltage applied to the I/O terminals is not applied to an operating circuit of the semiconductor device so that the operating circuit may be protected.

In order to form the ESD protection device in FIG. 1, the NMOS transistor, the resistor R and the capacitor C may be formed on a substrate, and the resistor R may have a desired resistance and the capacitor C may have a desired capacitance.

Referring to FIGS. 2, 3A, 3B and 3C, a substrate on which the ESD protection device may be formed may include an NMOS transistor region 100.

The NMOS transistor region 100 may include a capacitor region and a resistor region thereon. Each of the capacitor region and the resistor region may vertically overlap the NMOS transistor region 100, and thus an additional horizontal area is not used for the capacitor region and the resistor region on the substrate.

In at least one example embodiment, the NMOS transistor in the ESD protection device may be a FinFET. Therefore, the NMOS transistor region 100 may have a plurality of active fins 102 and a plurality of grooves 104 between the active fins 102. The active fins 102 may extend in a first direction, and be parallel to each other.

Alternatively, the NMOS transistor may be a planar transistor. In this case, an upper surface of the NMOS transistor region 100 may be flat.

The NMOS transistor region 100 may include a p-type well doped with p-type impurities. The substrate may be a p-type substrate lightly doped with p-type impurities.

An insulation layer 106 may be conformally formed on the active fins 102 and the grooves 104. Portions of the insulation layer 106 may serve as a gate insulation layer 106a, a dielectric layer 106b of a capacitor and an insulating interlayer 106c, respectively, according to locations thereof.

A gate electrode 120b may extend on the insulation layer 106 to cross over the active fins 102. The gate electrode 120b may have a linear shape extending in a second direction substantially perpendicular to the first direction.

The gate electrode 120b may include a metal. In at least one example embodiment, the gate electrode 120b may have a structure in which a barrier layer pattern and a metal pattern are sequentially stacked. Alternatively, the gate electrode 120b may include a semiconductor material doped with impurities, e.g., doped polysilicon.

A portion of the insulation layer 106 under the gate electrode 120b may serve as the gate insulation layer 106a of the NMOS transistor. A bottom surface of the gate electrode 120b may be formed on surfaces of the active fins 102 and the grooves 104, and thus may have concave portions and convex portions corresponding thereto.

The NMOS transistor region 100 may include a source 110 and a drain 112 of the NMOS transistor, and the source 110 and the drain 112 of the NMOS transistor may be arranged opposite to each other in the first direction. In at least one example embodiment, the drain 112 may be formed at a first side of the gate electrode 120b and the source 110 may be formed at a second side of the gate electrode 120b, and the second side of the gate electrode 120b may be arranged opposite to the first side of the gate electrode 120b in the first direction.

The source 110 may include a first source region 110a, a first source extension region 110b, and a second source region 110c. The drain 112 may include a first drain region 112a, a first drain extension region 112b and a second drain region 112c. In at least one example embodiment, the first source region 110a may be formed adjacent to the first drain region 112a. The first source region 110a may serve as an elevated source region, and the second source region 110c may contact a plurality of fifth contacts 130d. The first drain region 112a may serve as an elevated drain region, and the second drain region 112c may contact a plurality of second contacts 130a.

Upper portions of the source 110 and the drain 112 may be doped with n-type impurities. Each of the first and second source regions 110a and 110c and the first and second drain regions 112a and 112c may have a first concentration of impurities. Each of the source and drain extension regions 110b and 112b may have a second concentration of impurities lower than the first concentration of impurities.

A first width of the drain extension region 112b may be wider than widths of the first and second drain regions 112a and 112c. A second width of the source extension region 110b may be wider than widths of the first and second source regions 110a and 110c.

The gate electrode 120b may be located between of horizontal areas of the source 110 and the drain 112. The drain extension region 112b of the drain region 112 to which a high voltage may be applied may have a large width, and thus the first width may be larger than the second width. In addition, the drain 112 may have an area larger than that of the source 110. In this case, the gate electrode 120b may be closer to the source 110 from the center of the NMOS transistor region 100.

As illustrated in FIG. 3A, the NMOS transistor including the gate electrode 120b, the source 110 and the drain 112 may be formed on the NMOS transistor region 100.

A region above either the drain extension region 112b or the source extension region 110b may serve as the capacitor region. Another region above either the drain extension region 112b or the source extension region 110b, which does not serve as the capacitor region, may serve as the resistor region.

The capacitor in the ESD protection device may have, preferably, a high capacitance. Therefore, a region having a relatively wider horizontal area between the drain and source extension regions 112b and 110b may serve as the capacitor region. In at least one example embodiment, as shown in FIGS. 2, 3A, 3B and 3C, the horizontal area of the drain extension region 112b may be larger than that of the source extension region 110b, and thus a region above the drain extension region 112b may serve as the capacitor region, and a region above the source extension region 110b may serve as the resistor region.

An electrode pattern 120a may be formed on a portion of the insulation layer 106 on the drain extension region 112b. In other words, the electrode pattern 120a may overlap the drain extension region 112b in a third direction substantially perpendicular to a top surface of the substrate. The electrode pattern 120a may cover a top surface of the drain extension region 112b. The electrode pattern 120a and the gate electrode 120b may be spaced apart from each other.

The drain extension region 112b may serve as a lower electrode of the capacitor so that drain extension region 112b may serve as both of the impurity region of the NMOS transistor and the lower electrode of the capacitor. The electrode pattern 120a may serve as an upper electrode of the capacitor. A portion of the insulation layer 106 between the drain extension region 112b and the electrode pattern 120a may serve as a dielectric layer 106b of the capacitor.

Therefore, the drain extension region 112b together with the dielectric layer 106b and the electrode pattern 120a may serve as the capacitor.

As a horizontal area of the electrode pattern 120a increases, an overlapping area of the electrode pattern 120a with the drain extension region 112b may increase, and the capacitance of the capacitor may increase. In at least one example embodiment, the electrode pattern 120a may cover more than half of the top surface of the drain extension region 112b. The electrode pattern 120a may have a rectangular flat shape.

The electrode pattern 120a may be formed on surfaces of the active fins 102 and the grooves 104, and thus a bottom surface of the electrode pattern 120a may have protrusion and groove portions that correspond to active fins 102 and grooves 104. Thus, an effective area of the electrode pattern 120a may be increased.

The electrode pattern 120a may include a metal. The electrode pattern 120a may include a barrier layer pattern and a metal pattern, which may be sequentially stacked. Alternatively, the electrode pattern 120a may include a semiconductor material doped with impurities, e.g., doped polysilicon.

A resistor 122 may be formed on a portion of the insulation layer 106 on the source extension region 110b. In other words, the resistor 122 may overlap the source extension region 110b. The resistor 122 may include resistance line patterns 108c, first contacts 122a and connection patterns 122b.

The resistance line patterns 108c may have a linear shape extending in the second direction. The resistance line patterns 108c may be parallel to each other. The resistance line patterns 108c may include a conductive material, e.g., doped polysilicon.

The resistance line patterns 108c may be electrically connected to each other at end portions thereof via the first contacts 122a and the connection patterns 122b, so that the resistance line patterns 108c may have a shape of a continuous line. In at least one example embodiment, the first contacts 122a may be formed on end portions of the resistance line patterns 108c, and the connection patterns 122b may be formed on the first contacts 122a adjacent to each other so that the first contacts 122a may be electrically connected to each other through the connection patterns 122b. The first contacts 122a and the connection patterns 122b may include a metal.

In at least one example embodiment, the gate electrode 120b and the electrode pattern 120a may include a material substantially the same as each other. Alternatively, the gate electrode 120b, the electrode pattern 120a and the resistance line pattern 108c may include, e.g., doped polysilicon.

In at least one example embodiment, top surfaces of the gate electrode 120b and the electrode pattern 120a may be coplanar with each other. Alternatively, top surfaces of the gate electrode 120b, the electrode pattern 120a and the resistance line pattern 108c may be coplanar with each other.

The insulating interlayer 128 may cover the NMOS transistor, the capacitor and the resistance line pattern 108c. The NMOS transistor, the capacitor and the resistor 122 may be electrically connected to each other through conductive wirings.

A first wiring line may include second contacts 132a, a drain line 132, and may be electrically connected to the second drain region 112c.

The drain line 132 may be formed on the second contacts 130a, and may be electrically connected to the second drain region 112c therebeneath. The drain line 132 may include a metal. The drain line 132 may have a linear shape extending in the second direction. A bottom surface of the drain line 132 may be higher than the top surface of the electrode pattern 120a of the capacitor. The drain line 132 may be spaced apart from a sidewall of the electrode pattern 120a of the capacitor in the second direction.

The electrode pattern 120a may be electrically connected to the gate electrode 120b, and the resistor 122 may be electrically connected to the gate electrode 120b.

A plurality of third contacts 130b may be formed on the electrode pattern 120a of the capacitor. At least one fourth contacts 130c may be formed on the gate electrode 120b.

A first connection line 134 may connect the third contacts 130b and the fourth contacts 130c. A second connection line 136 may connect at least one of the first contacts 122a, which is electrically connected to the fourth contact 130c, to the resistance line patterns 130b. As illustrated in FIGS. 2 and 3A, 3B and 3C, the first and second connection lines 134 and 136 may be a single wiring. The first and the second connection lines 134 and 136 may include a metal.

A second wiring may include a plurality of fifth contacts 130d, a third connection line 140, a source line 138 and the connection patterns 122b, and may be electrically connected to the second source region 110c.

The fifth contacts 130d may contact a top surface of the second source region 110c. The fifth contacts 130d may be further formed on the top surface of the active fins 102. The source line 138 may be electrically connected to the fifth contacts 130d so that the source line 138 may be electrically connected to the second source region 110c. The source line 138 may include a metal, and serve as a second wiring electrically connected to the second source region 110c. The source line 138 may have a linear shape extending in the second direction.

The source line 138 may be electrically connected to the resistor 122. The third connection line 140 may be formed on a side of the source line 138 to contact at least one of the first contacts 122a.

In the ESD protection device in accordance with at least one example embodiment, the capacitor and the resistor may be formed on the NMOS transistor. The ESD protection device according to at least one example embodiment may include a horizontal area for forming the NMOS transistor, but does not include an additional horizontal area for forming the capacitor and resistor. Therefore, the horizontal area of the ESD protection device may be decreased. In addition, the ESD protection device may have a high capacitance and a low resistance in a narrow horizontal area, so that the ESD protection device may be used for a semiconductor device having a high integration degree.

FIGS. 4 to 8 are cross-sectional views illustrating stages of a method of manufacturing the ESD protection device in FIG. 2. FIGS. 4 to 8 are cross-sectional views of the ESD protection device cut along the line A-A' and the line D-D' in FIG. 2.

Figure 4:
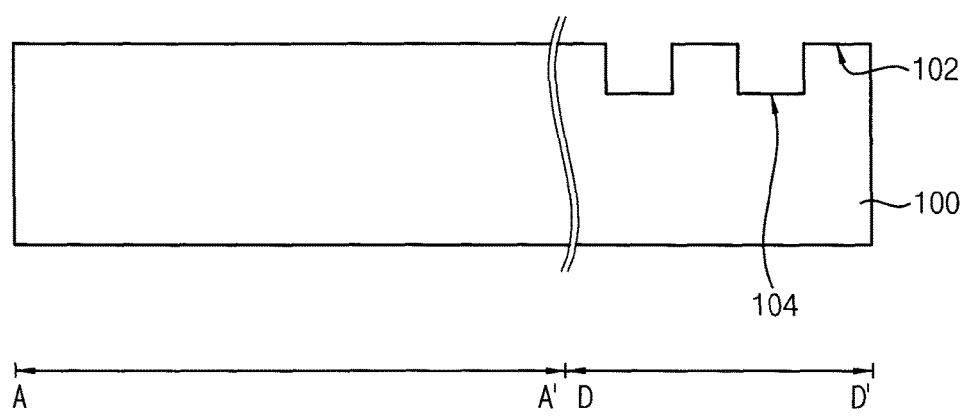

Referring to FIG. 4, a plurality of active fins 102 and a plurality of grooves 104 may be formed on a substrate for forming the ESD protection device.

Particularly, the substrate may be partially etched to form the active fins 102 and the grooves 104. Alternatively, the active fins 102 and the grooves 104 may be formed by an epitaxial growth process on the substrate.

Figure 5:
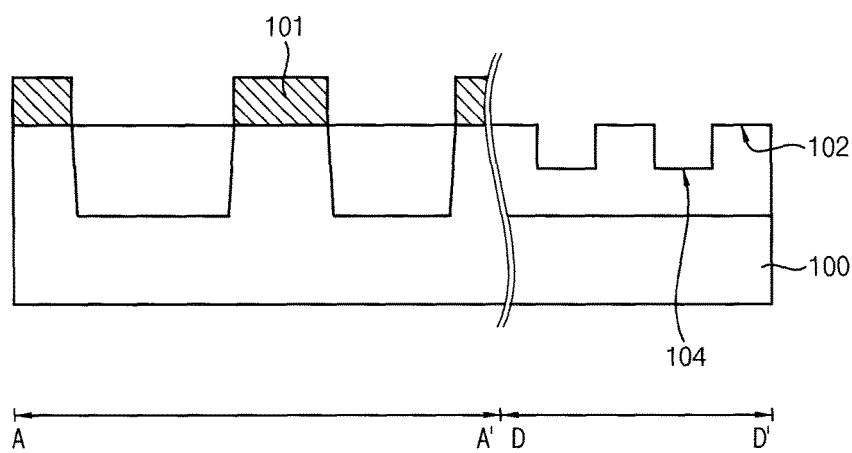

Referring to FIG. 5, impurities may be implanted into the substrate to form a source extension region 110b and a drain extension region 112b.

In at least one example embodiment, an ion implantation mask 101 may be formed on the substrate to expose portions of the substrate. P-type impurities may be implanted into the exposed portions of the substrate to form the source and drain extension regions 110b and 112b. Then, the ion implantation mask 101 may be removed. The ion implantation process may be performed prior to forming various patterns for circuits, e.g., polysilicon patterns.

Figure 6:
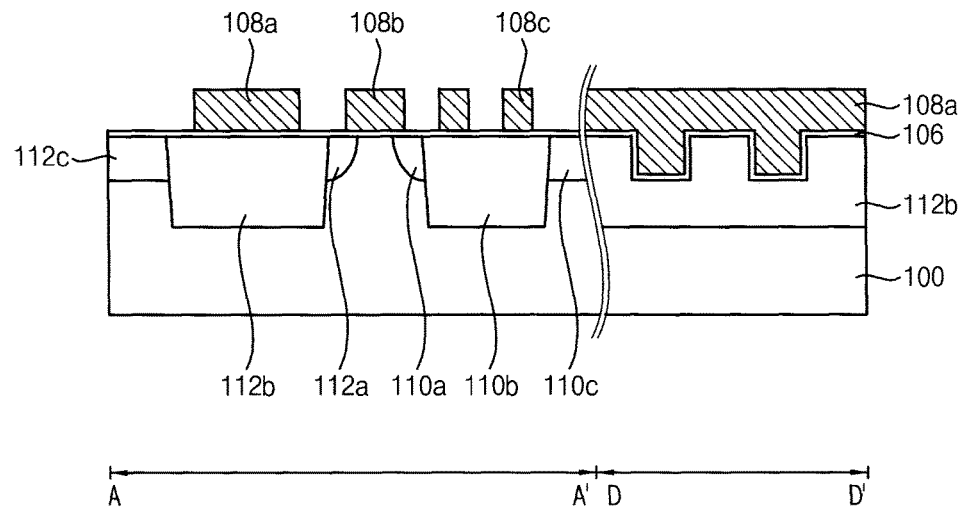

Referring to FIG. 6, a preliminary electrode pattern 108a, a preliminary gate pattern 108b and a resistance line pattern 108c may be formed.

Particularly, an insulation layer 106 may be formed on the substrate. The insulation layer 106 may be conformally formed on the active fins 102 and the grooves 104. A polysilicon layer may be formed on the insulation layer 106, and a top surface of the polysilicon layer may be higher than those the active fins 102. A planarization process may be performed so that the polysilicon layer may have a flat top surface. The polysilicon layer may be patterned to form the preliminary electrode pattern 108a, the preliminary gate pattern 108b and the resistance line pattern 188c.

N-type impurities may be implanted into the substrate so that a first source region 110a, a second source region 110c, a first drain region 112a and a second drain region 112c may be formed. Each of the first and second source regions 110a and 110c and the first and second drain regions 112a and 112c may have an impurity concentration higher than those of the source and drain extension region regions 110b and 112b.

Figure 7:
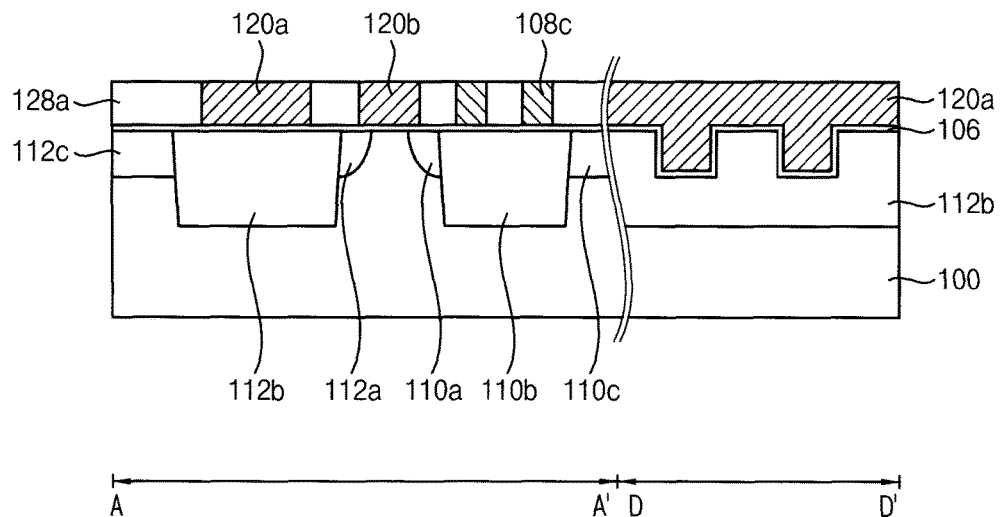

Referring to FIG. 7, a first insulating interlayer 128a may be formed to cover the preliminary electrode pattern 108a, the preliminary gate pattern 108b and the resistance line pattern 108c. An upper portion of the first insulation interlayer 128a may be planarized to expose top surfaces of the preliminary electrode pattern 108a, the preliminary gate pattern 108b and the resistance line pattern 108c.

The preliminary electrode pattern 108a and the preliminary gate pattern 108b may be removed to form spaces (not shown). A metal layer may be formed to fill the spaces, and the metal layer may be planarized to expose a top surface of the first insulation interlayer 128a so that an electrode pattern 120a and a gate electrode 120b may be formed.

In at least one example embodiment, after removing the preliminary electrode pattern 108a and the preliminary gate pattern 108b to expose portions of the insulation layer 106, the exposed portions of the insulation layer 106 may be removed to expose portions of the substrate. A gate dielectric layer (not shown) may be formed on the exposed portions of the substrate, and the metal layer may be formed to form the electrode pattern 120a and the gate electrode 120b.

In at least one example embodiment, the electrode pattern 120a and the gate electrode 120b may be formed to include a semiconductor material, e.g., polysilicon. In this case, the process for removing the preliminary electrode pattern 108a and the preliminary gate pattern 108b to form the spaces and the process for filling the spaces with a metal may be skipped. That is, the preliminary electrode pattern 108a may serve as the electrode pattern of the capacitor, and the preliminary gate pattern 108b may serve as the gate electrode of the NMOS transistor.

Figure 8:
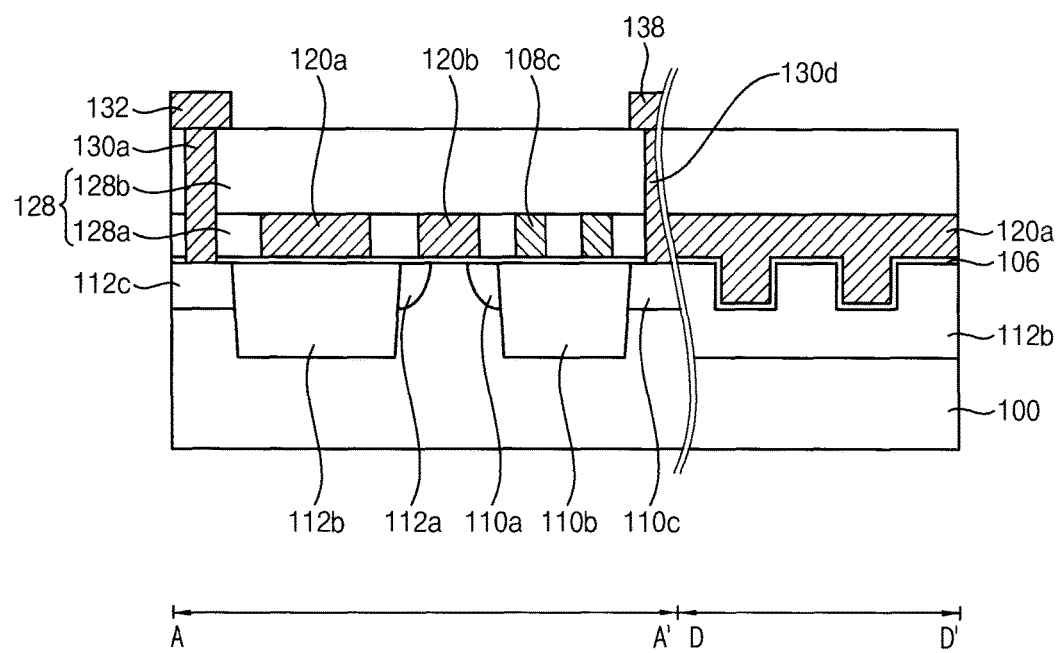

Referring to FIGS. 8 and 2, a second insulating interlayer 128b may be formed, and first to fifth contacts 122a, 130a, 130b, 130c and 130d may be formed through the first and second insulating interlayers 128a and 128b. A connection pattern 122b, a drain line 132, first and second connection lines 134 and 136, and a source line 138 may be formed.

Particularly, after forming the second insulating interlayer 128b, the first and second insulating interlayers 128a and 128b may be partially etched to form first and fifth contact holes (not shown). The first contact holes may be formed to expose top surfaces of the resistance line patterns 108c. The second contact holes may be formed to expose a top surface of the second drain region 112c. The third contacts holes may be formed to expose a top surface of the electrode pattern 120a. The fourth contact holes may be formed to expose a top surface of the gate electrode 120b. The fifth contact holes may be formed to expose a top surface of the second source region 110c.

A conductive layer may be formed to fill the first to fifth contact holes. The conductive layer may be planarized to expose a top surface of the second insulating interlayer 128b to form the first to fifth contacts 122a, 130a, 130b, 130c and 130d. The conductive layer may be formed to include a metal. In at least one example embodiment, the conductive layer may be formed to include a barrier layer and a metal layer.

The connection pattern 122b, the drain line 132, the first and second connection lines 134 and 136 and the source line 138 may be formed on the first to fifth contacts 122a, 130a, 130b, 130c and 130d, respectively. The connection pattern 122b may be formed on the first contacts 122a, and the first contacts 122a may be connected to each other through the connection pattern 122b. The drain line 132 may be formed on the second contacts 130a, and the second contacts 130a may be connected to each other through the drain line 132. The first connection line 134 may be formed on the third and fourth contacts 103b and 103c, and the third and fourth contacts 130b and 130c may be connected to each other through the first connection line 134. The second connection line 136 may be formed on the fourth contacts 130c and at least one of the first contacts 122a, and the fourth contact 130c and the at least one of the first contacts 122a contacting the resistance line pattern 130b may be connected to each other through the second connection line 136. The source line 138 may be formed on the fifth contacts 130d, and the fifth contacts 130d may be connected to each other through the source line 138.

The ESD protection device in FIG. 2 may be manufactured by performing the above processes.

Figure 9:
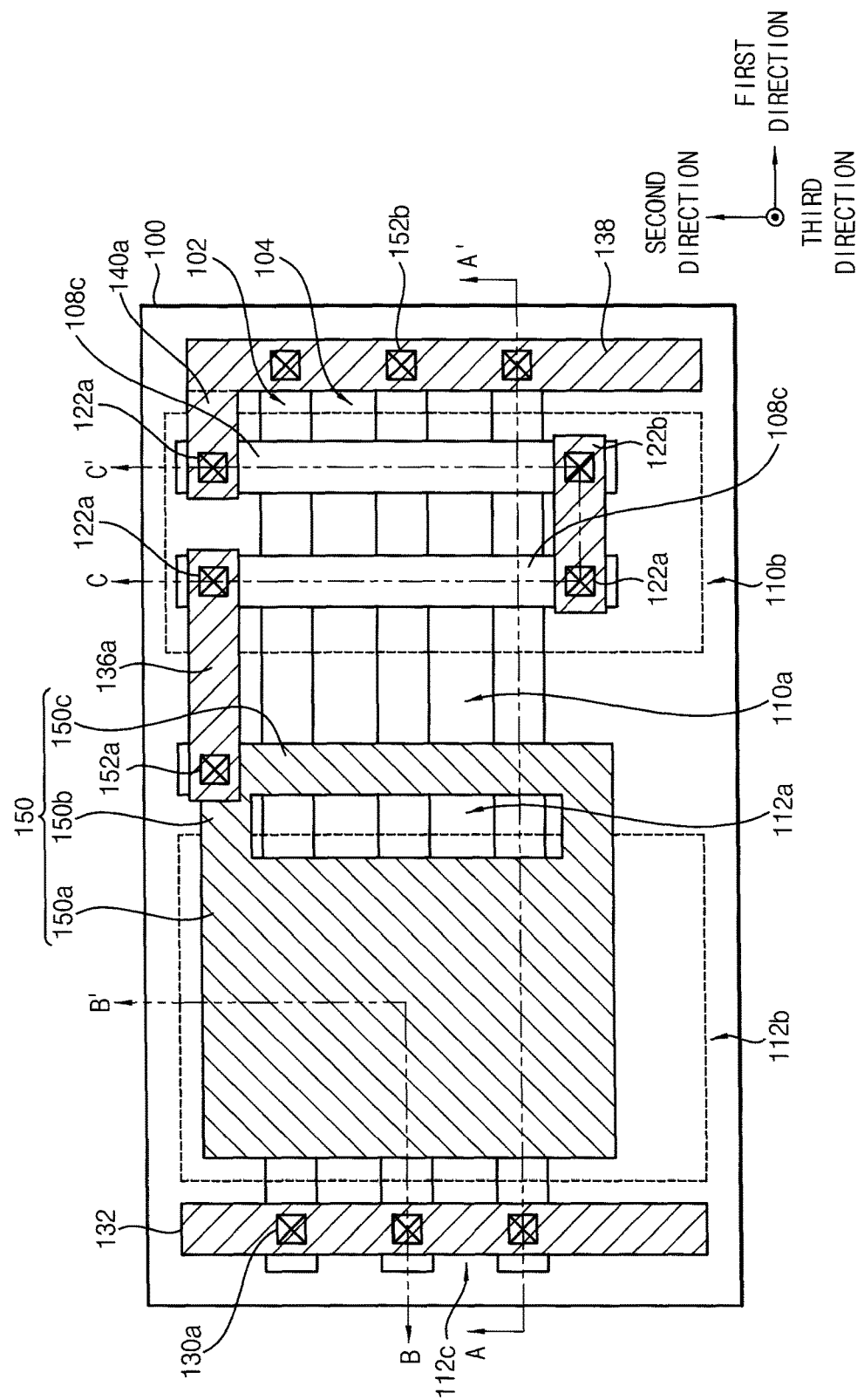
Figure 10:
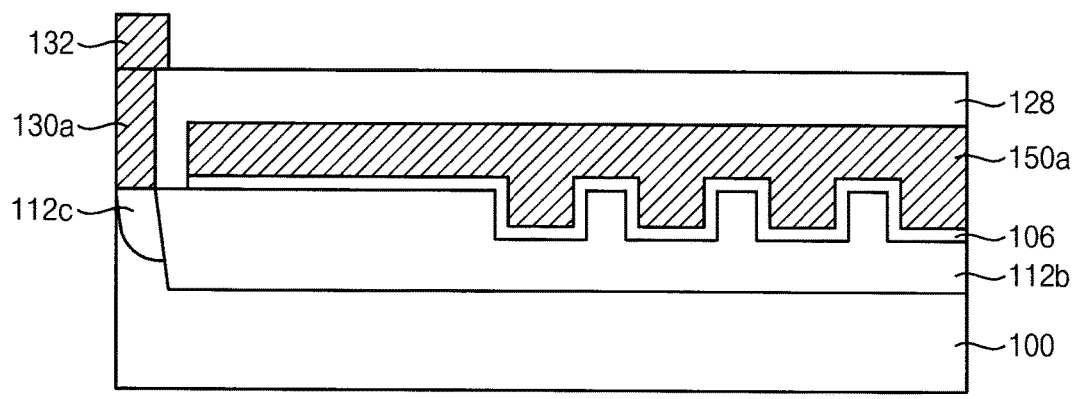

FIG. 9 is a top view illustrating an ESD protection device in accordance with at least one example embodiment. FIG. 10 is a cross-sectional view of the ESD protection device cut along a line B-B' in FIG. 9.

The ESD protection device in FIG. 9 may be substantially the same as or similar to that of FIG. 2 except for structures of an electrode pattern of a capacitor, a gate electrode of an NMOS transistor and wirings. Thus, like reference numerals refer to like elements, and detailed descriptions thereon are omitted herein. In addition, cross-sectional views of the ESD protection device cut along lines A-A' and C-C' in FIG. 9 may be substantially the same as those of FIGS. 3B and 3C, respectively.

Referring to FIGS. 9 and 10, a substrate on which the device may be formed may include an NMOS transistor region 100. The NMOS transistor region 100 may include a capacitor region and a resistor region thereon. The NMOS transistor of the ESD protection device may be a FinFET. Therefore, the NMOS transistor region 100 may have a plurality of active fins 102 and a plurality of grooves 104 between the active fins 102.

An insulation layer 106 may be conformally formed on the active fins 102 and the grooves 104. Portions of the insulation layer 106 may serve as a gate insulation layer of the NMOS transistor, a dielectric layer of the capacitor and an insulating interlayer, respectively, according to locations thereof.

An integrated electrode 150 in which a gate electrode 150c and an electrode pattern 150a of the transistor may be integrally formed with no additional upper wirings may be formed on the insulation layer 106. The integrated electrode 150 may include the gate electrode 150c, the electrode pattern 150a and a connection region 150b. The gate electrode 150c may have a top surface substantially coplanar with those of electrode pattern 150a and the connection region 150b. The gate electrode 150c may be electrically connected to the electrode pattern 150a without additional contacts or upper wirings.

The gate electrode 150c may have a linear shape extending in a second direction. A region above a drain extension region 112b may serve as the capacitor region, which may be formed at a first side of the gate electrode 150c. A region above a source extension region 110b may serve as the resistor region, which may be formed at a second side of the gate electrode 150c. The second side of the gate electrode 150c may be arranged opposite to the first side of the gate electrode 150c in the first direction. Therefore, the capacitor region and the resistor region may be arranged opposite to each other in the first direction substantially perpendicular to the second direction.

The electrode pattern 150a may cover an upper portion of the drain extension region 112b. In at least one example embodiment, the electrode pattern 150a may cover more than half of the upper portion of the drain extension region 112b. A sidewall of the electrode pattern 150a may be spaced apart from a sidewall of the gate electrode 150c.

The connection region 150b may be disposed between the electrode pattern 150a and the gate electrode 150c, which may be electrically connected to the electrode pattern 150a and the gate electrode 150c. Each sidewall of the connection region 150b may contact sidewalls of the electrode pattern 150a and the gate electrode 150c. The connection region 150b may include at least one pattern. The connection region 150b may be formed on a portion of the insulation layer 106 beneath which the active fins 102 are not be formed. As illustrated in FIGS. 9 and 10, the connection region 150b may be electrically connected to each sidewall of the electrode pattern 150a and the gate electrode 150c in the second direction. Therefore, the integrated electrode 150 may include an opening (not shown) therein.

The electrode pattern 150a, the connection region 150b and the gate electrode 150c may include a material substantially the same as each other. In at least one example embodiment, the integrated electrode 150 may include a metal. For example, the integrated electrode 150 may have a structure in which a barrier layer pattern and a metal pattern are sequentially stacked. In order to form the integrated electrode 150 including a metal, a preliminary integrated electrode may be formed using a polysilicon. The preliminary integrated electrode may be removed to form spaces, and the spaces may be filled with the metal.

Alternatively, the integrated electrode 150 may include a semiconductor material doped with impurities e.g., doped polysilicon. In this case, a polysilicon layer may be formed through a deposition process, and the polysilicon layer may be partially etched to form the integrated electrode 150.

The electrode pattern 150a may serve as an electrode pattern of the capacitor, and the gate electrode 150c may serve as a gate electrode of the NMOS transistor.

A resistor may be formed on a portion of the insulation layer 106 on the source extension region 110b. The resistor may include resistance line patterns 108c, first contacts 122a and connection patterns 122b. The first contacts 122a and the connection patterns 112b may include a metal. A structure of the resistor may be substantially the same as that of FIG. 2.

In at least one example embodiment, the resistance line patterns 108c may have a top surface coplanar with that of the integrated electrode 150.

An insulating interlayer 128 may cover the NMOS transistor, the capacitor and the resistance line patterns 108c. The NMOS transistor, the capacitor and the resistor may be electrically connected to each other through conductive wirings.

A first wiring may be electrically connected to a second drain region 112c of the NMOS transistor (not shown). The first wiring may include second contacts 130a and a drain line 132. The second contacts 130a may be electrically connected to the second drain region 112c and the drain line 132 may be electrically connected to the second contacts 130a. The drain line 132 may include a metal.

The gate electrode 150c may be electrically connected to the resistor.

At least a third contact 152a may be formed on the gate electrode 150c. A first connection line 136a may be electrically connected to at least one of the third contacts 152a and the first contacts 122a. The first connection line 136a may include a metal.

A second wiring may be electrically connected to a second source region 110c of the NMOS transistor. The second wiring may include fourth contacts 152b and a source line 138. The fourth contacts 152b may be electrically connected to the second source region 110c. The source line 138 may be electrically connected to the fourth contacts 152b. The source line 138 may include a metal.

The source line 138 may be electrically connected to the resistor. A second connection line 140a may be connected to the source line 138 and at least one of the first contacts 122a. The second connection line 140a may contact a sidewall of the source line 138. In other words, the source line 138 may be formed as a single pattern together with the second connection line 140a In the ESD protection device in accordance with at least one example embodiment, the integrated electrode 150 may include the gate electrode 150c and the electrode pattern 150a of the capacitor, which does not include additional upper wirings for connecting the gate electrode 150c and the electrode pattern 150a of the capacitor. Therefore, the number of the wirings may be decreased so that the ESD protection device may have a simple structure.

The ESD protection device in FIG. 9 may be formed through processes substantially the same as or similar to those of FIGS. 4 to 8.

In order to form the ESD protection device in FIG. 9, a process illustrated with reference to FIGS. 4 to 5 may be performed to form the ESD protection device in FIG. 5.

An insulation layer 106 may be formed on a substrate, and a polysilicon layer may be formed on the insulation layer 106. The polysilicon layer may be patterned to form a preliminary integrated electrode and a resistance line pattern. The preliminary integrated electrode may be formed to have a structure substantially the same as that of FIG. 9. The preliminary integrated electrode may be formed to include a preliminary electrode pattern, a preliminary gate electrode and a preliminary connection region. As illustrated in FIG. 6, impurities may be implanted into the substrate to form first and second source regions 110a and 110c and first and second drain regions 112a and 112c, respectively.

Processes illustrated with reference to FIGS. 7 and 8 may be performed to form the ESD protection device in FIG. 9.

Figure 11:
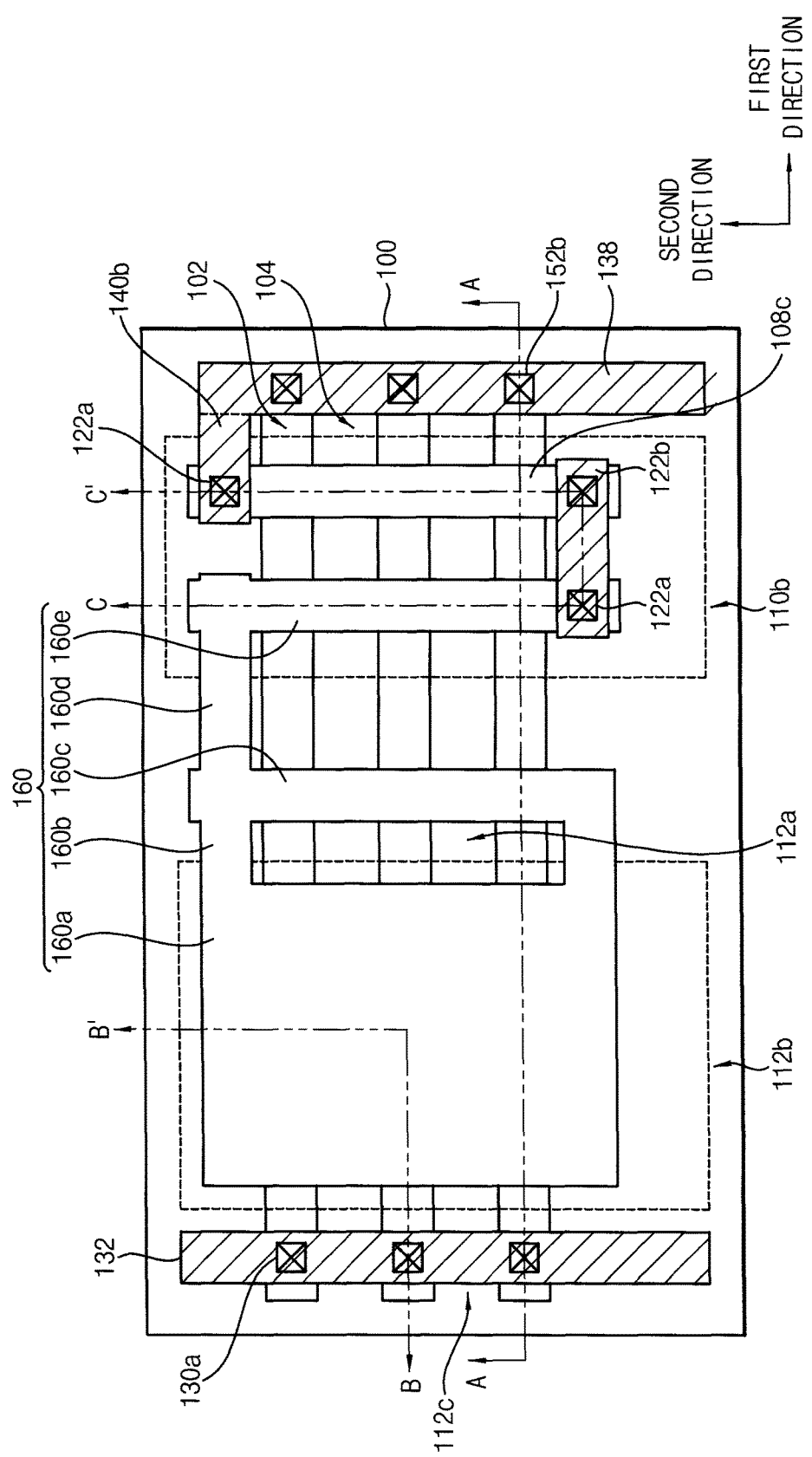
Figure 12:
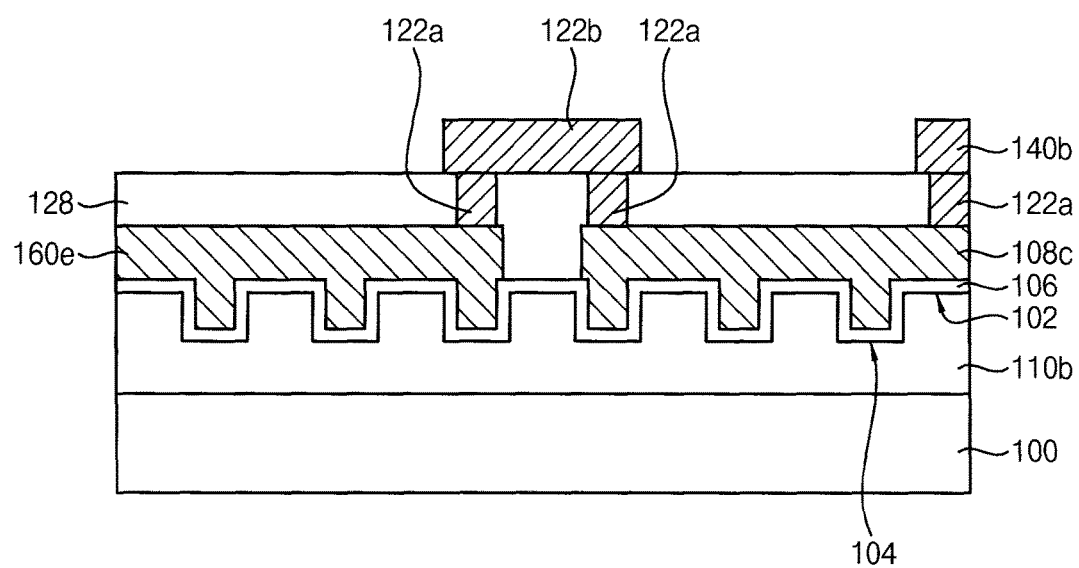

FIG. 11 is a top view illustrating an ESD protection device in accordance with at least one example embodiment. FIG. 12 is a cross-sectional view of the ESD protection device cut along a line C-C' in FIG. 11.

The ESD protection device in FIG. 11 may be substantially the same as or similar to that of FIG. 9 except for structures of an electrode pattern of a capacitor, a gate electrode of an NMOS transistor and wirings. Thus, like reference numerals refer to like elements, and detailed descriptions thereon are omitted herein. In addition, cross-sectional views of the ESD protection device cut along lines A-A' and B-B' in FIG. 11 may be substantially the same as the cross-sectional views of FIGS. 3A and 10, respectively.

Referring to FIGS. 11 and 12, a substrate may include an NMOS transistor region 100. The NMOS transistor region 100 may include a capacitor region and a resistor region thereon. The NMOS transistor region 100 may have a plurality of active fins 102 and a plurality of grooves 104 between the active fins 102.

An insulation layer 106 may be conformally formed on the active fins 102 and the grooves 104. Portions of the insulation layer 106 may serve as a gate insulation layer 106a of the NMOS transistor, a dielectric layer 106b of the capacitor and an insulating interlayer, respectively, according to locations thereof.

An integrated electrode 160 may be formed on a portion of the insulation layer 106. The integrated electrode 160 may include a gate electrode 160c, an electrode pattern 160a of the capacitor, a first resistance pattern 160e of a resistor, a first connection region 160b and a second connection region 160d. The gate electrode 160c of the transistor and the electrode pattern 160a of the capacitor may be integrally formed with no additional upper wirings. The gate electrode 160c, the electrode pattern 160a and the first resistance pattern 160e may be electrically connected to each other via the first and second connection regions 160b and 160d, so that no additional contacts or upper wirings are used. The gate electrode 160c, the electrode pattern 160a and the first resistance pattern 160e may have a continuous structure as a single structure.

A region above a drain extension region 112b may serve as the capacitor region. In addition, a region above a source extension region 110b may serve as the resistor region. The capacitor region and the resistor region may be arranged opposite to each other in the first direction.

The gate electrode 160c may have a linear shape extending in the second direction. The electrode pattern 160a may cover a top surface of the drain extension region 112b.

The first connection region 160b may be disposed between the electrode pattern 160a and the gate electrode 160c, and be electrically connected to the electrode pattern 160a and the gate electrode 160c. The first connection region 160b may contact an end portion of a sidewall of each of the electrode pattern 160a and the gate electrode 160c in the second direction.

The first resistance pattern 160e may serve as one of resistance line patterns, which may be closest to the gate electrode 160c on the region above the source extension region 110b. The first resistance pattern 160e may have a linear shape extending in the second direction.

The second connection region 160d may be disposed between the gate electrode 160c and the first resistance pattern 160e, and may be electrically connected to the gate electrode 160c and the first resistance pattern 160e. The second connection region 160d may contact an end portion of a sidewall of each of the gate electrode 160c and the first resistance pattern 160e in the second direction.

The integrated electrode 160 may include a semiconductor material doped with impurities, e.g., doped polysilicon.

The electrode pattern 160a may serve as an electrode pattern of the capacitor, and the gate electrode 160c may serve as a gate electrode of the NMOS transistor. In addition, the first resistance pattern 160e may be a portion of the resistor.

The resistor may be formed on portions of the insulation layer 106 on the source extension region 110b, which may include the first resistance pattern 160e, second resistance line patterns 108c, first contacts 122a and connection patterns 122b. The second resistance line patterns 108c may be spaced apart form the sidewall of the integrated electrode 160, and may have a linear shape extending in the second direction. The second resistance line patterns 108c may include a material substantially the same as that of the integrated electrode 160. The second resistance line patterns 108 may include a semiconductor material doped with impurities, e.g., doped polysilicon.

In at least one example embodiment, a top surface of the integrated electrode 160 may be coplanar with that of the second resistance line patterns 108c.

The second resistance line patterns 108c may be electrically connected to each other at end portions thereof via the first contacts 122a and the connection patterns 122b, so that the second resistance line patterns 108c may have a shape of a continuous line. The first contacts 122a and the connection patterns 122b may include a metal.

Second contacts 130a and a drain line 132 may be electrically connected to a second drain region of the NMOS transistor therebeneath, and may be referred to as a first wiring. Fourth contacts 152c and a source line 138 may be electrically connected to a second source region of the NMOS transistor therebeneath, and may be referred to as a second wiring. The first and second wirings may have structures substantially the same as or similar to the structures in FIG. 9.

Hereinafter, a method of manufacturing the ESD protection device in FIG. 11 will be illustrated briefly.

In order to form the ESD protection device in FIG. 11, a process illustrated with reference to FIGS. 4 to 5 may be performed to form the ESD protection device in FIG. 5.

An insulation layer 106 may be formed on a substrate, and a polysilicon layer may be formed on the insulation layer 106. The polysilicon layer may be patterned to form an integrated electrode 160 and a second resistance line pattern 108c. The integrated electrode 160 may be formed to have a structure substantially the same as that of the integrated electrode in FIG. 11. In other words, the integrated electrode 160 may be formed to include an electrode pattern 160a, a first connection region 160b, a gate electrode 160c, a second connection region 160d and a first resistance pattern 160e. As illustrated in FIG. 6, impurities may be implanted into the substrate to form first and second source regions 110a and 110c and first and second drain regions 112a and 112c, respectively.

The integrated electrode 160 of the ESD protection device in FIG. 11 may be formed to include a semiconductor material doped with impurities e.g., doped polysilicon. In this case, a polysilicon layer may be formed through a deposition process, and the polysilicon layer may be patterned to form the integrated electrode 160.

Then, the process illustrated with reference to FIG. 8 may be performed to form the ESD protection device in FIG. 11.

Figure 13:
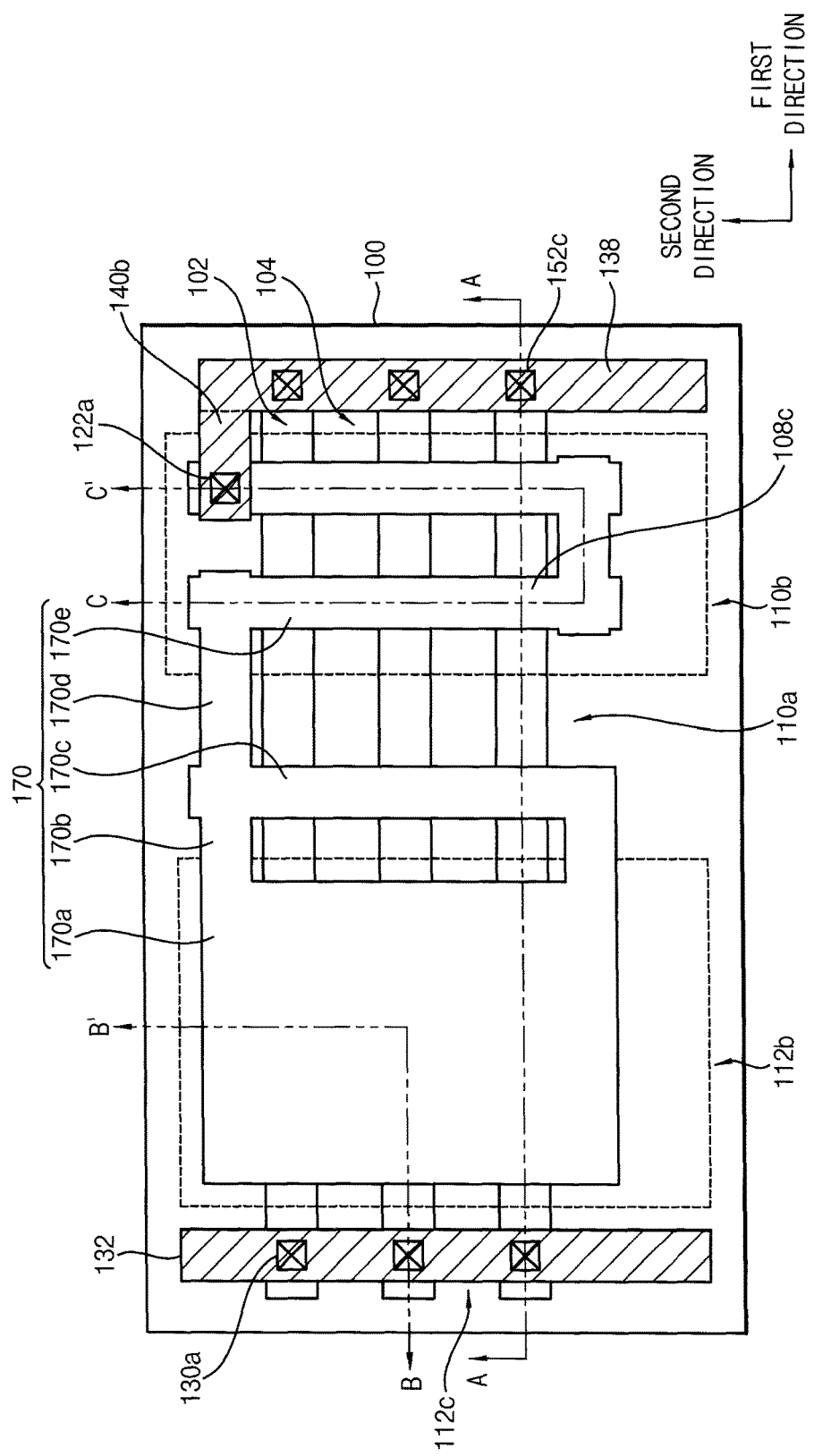

FIG. 13 is a top view illustrating an ESD protection device in accordance with at least one example embodiment.

Figure 14:
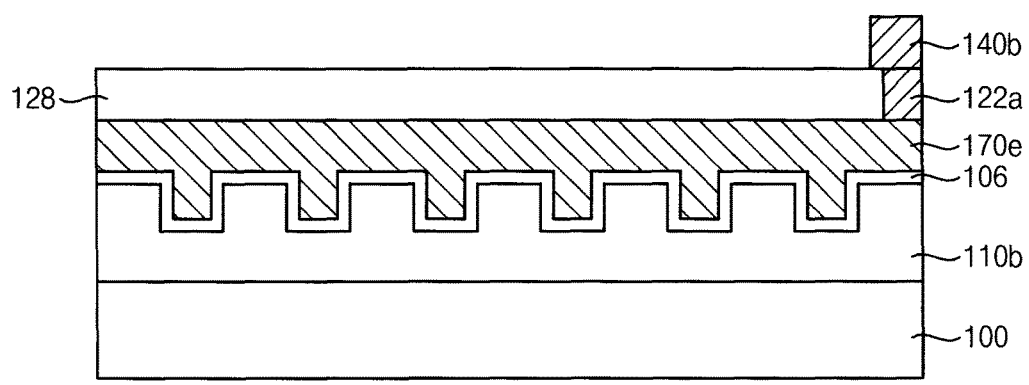

FIG. 14 is a cross-sectional view of the ESD protection device cut along a line C-C' in FIG. 13.

The ESD protection device in FIG. 13 may be substantially the same as or similar to that of FIG. 9 except for structures of an electrode pattern of a capacitor, a gate electrode of an NMOS transistor and a resistor. Thus, like reference numerals refer to like elements, and detailed descriptions thereon are omitted herein. In addition, cross-sectional views of the ESD protection device cut along lines A-A' and B-B' in FIG. 11 may be substantially the same as the cross-sectional views of FIGS. 3A and 10, respectively.

Referring to FIGS. 13 and 14, a substrate may include an NMOS transistor region 100. The NMOS transistor region 100 may include a capacitor region and a resistor region thereon. The NMOS transistor region 100 may have a plurality of active fins 102 and a plurality of grooves 104 between the active fins 102.

An insulation layer 106 may be conformally formed on the active fins 102 and the grooves 104. Portions of the insulation layer 106 may serve as a gate insulation layer of the NMOS transistor, a dielectric layer of the capacitor, and an insulating interlayer, respectively, according to locations thereof.

An integrated electrode 170 may be formed on a portion of the insulation layer 106. The integrated electrode 170 may include an electrode pattern 170a, a first connection region 170b, a gate electrode 170c, a second connection region 170d and a resistance region 170e of the resistor. The gate electrode 170c and the electrode pattern 170a of the transistor may be integrally formed with no additional upper wirings. The gate electrode 170c, the electrode pattern 170a and the resistor may be electrically connected to each other via the first and second connection regions 170b and 170d, so that no additional contacts or upper wirings are used.

A region above a drain extension region 112b may serve as the capacitor region. In addition, a region above a source extension region 110b may serve as the resistor region. The capacitor region and the resistor region may be arranged opposite to each other in the first direction.

The gate electrode 170c may have a linear shape extending in the second direction.

The electrode pattern 170a may cover a top surface of the drain extension region 112b.

The first connection region 170b may be disposed between the electrode pattern 170a and the gate electrode 170c, and connect the electrode pattern 170a and the gate electrode 170c.

The resistance region 170e may have a linear shape extending in the second direction on the source extension region 110b. In other words, the resistance region 170e may include an extended region in the second direction and a connection region. The connection region may be electrically connected to end portions of the extension region. As illustrated in FIG. 11, the resistor may have a shape of the letter "S", which may be continuous in the first direction.

The second connection region 170d may be disposed between the gate electrode 170c and the resistance pattern 170e, and may be electrically connected to the gate electrode 170c and the resistance pattern 170e.

The integrated electrode 170 may include a semiconductor material doped with impurities, e.g., doped polysilicon.

The electrode pattern 170a may serve as an electrode pattern of the capacitor, and the gate electrode 170c may serve as a gate electrode of the NMOS transistor.

Second contacts 130a and a drain line 132 may be electrically connected to a second drain region 112c of the NMOS transistor therebeneath, and may be referred to as a first wiring. Fourth contacts 152c and a source line 138 may be electrically connected to a second source region of the NMOS transistor therebeneath, and may be referred to as a second wiring. The first and second wirings may have structures substantially the same as or similar to the structures in FIG. 9.

Therefore, the number of wirings may be decreased so that the ESD protection device may have a simple structure. The NMOS transistor, the capacitor and the resistor may be formed as the integrated electrode having no additional wirings. Thus, no additional wirings are used except for the first and second wirings. The number of the wiring may be decreased so that the ESD protection device may have a simple structure.

Hereinafter, a method of manufacturing the ESD protection device in FIG. 13 will be illustrated.

In order to form the ESD protection device in FIG. 13, a process illustrated with reference to FIGS. 4 to 5 may be performed to form the ESD protection device in FIG. 5.

Then, an insulation layer 106 may be formed on a substrate, and a polysilicon layer may be formed on the insulation layer 106. The polysilicon layer may be patterned to form an integrated electrode 170. The integrated electrode 170 may be formed to have a structure substantially the same as that of the integrated electrode in FIG. 13. In other words, the integrated electrode 170 may be formed to include an electrode pattern 170, a first connection region 170b, a gate electrode 170c, a second connection region 170d and a resistance region 170e. Then, as illustrated in FIG. 6, impurities may be implanted into the substrate to form first and second source regions 110a and 110c and first and second drain regions 112a and 112c, respectively.

The integrated electrode 170 of the ESD protection device in FIG. 13 may be formed to include a semiconductor material doped with impurities e.g., doped polysilicon. In this case, a polysilicon layer may be formed through a deposition process, and the polysilicon layer may be patterned to form the integrated electrode 170.

Then, the process illustrated with reference to FIG. 8 may be performed to form the ESD protection device in FIG. 11.

Figure 15:
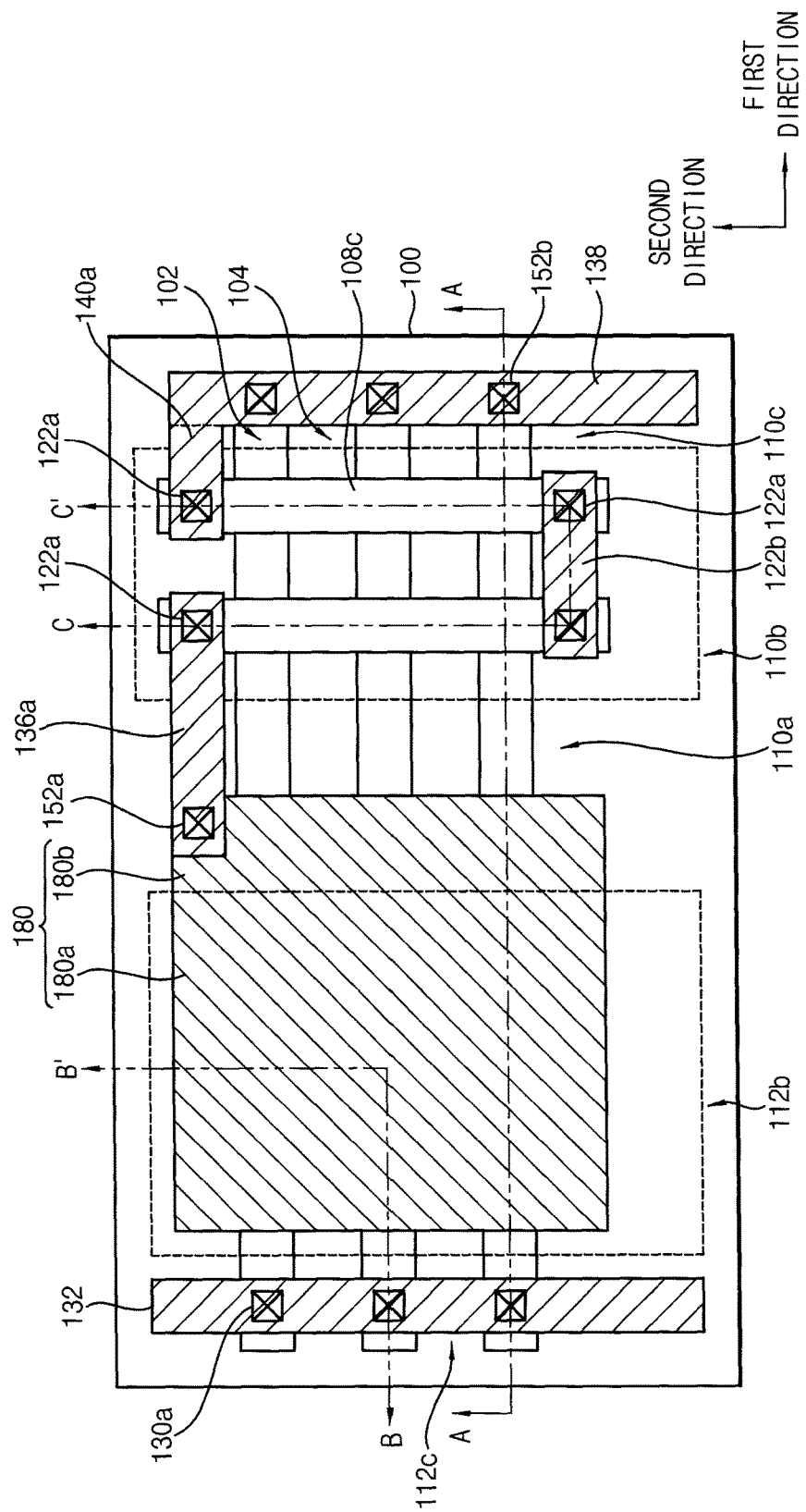
Figure 16:
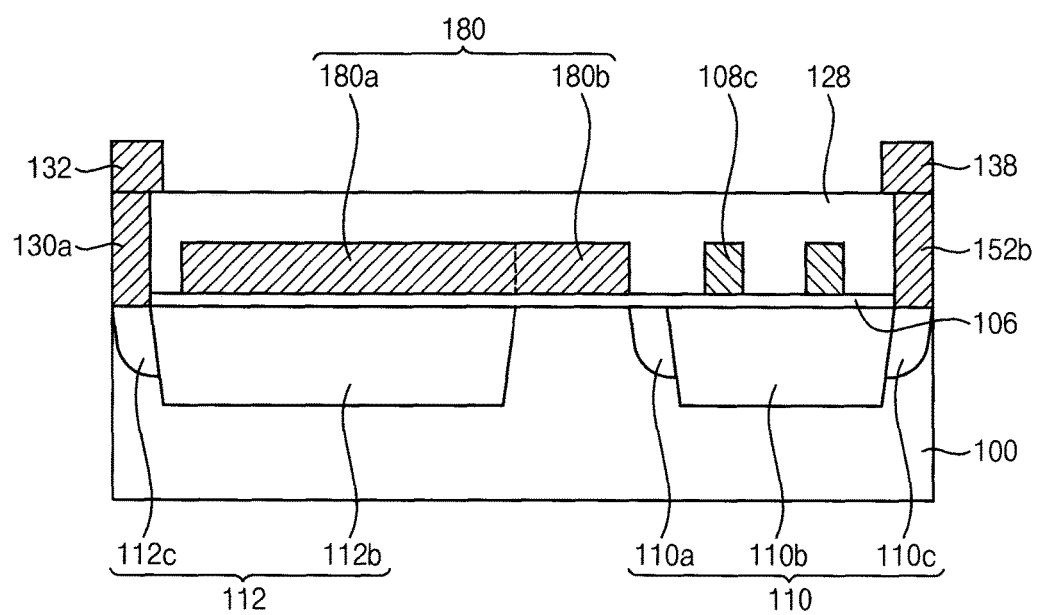
Figure 18A:
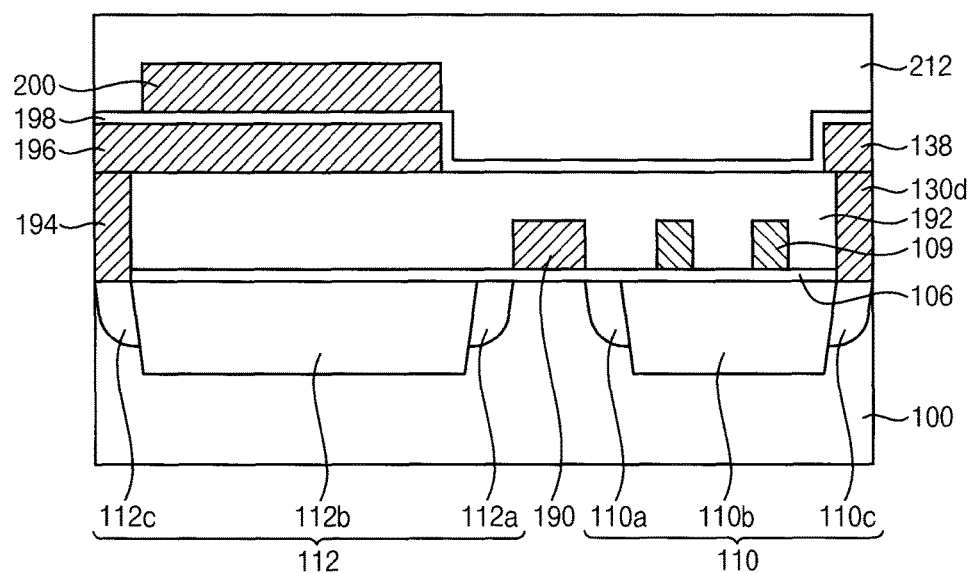
FIG. 18A is a cross-sectional view of the ESD protection device cut along a line A-A' in FIG. 17.
Figure 18B:
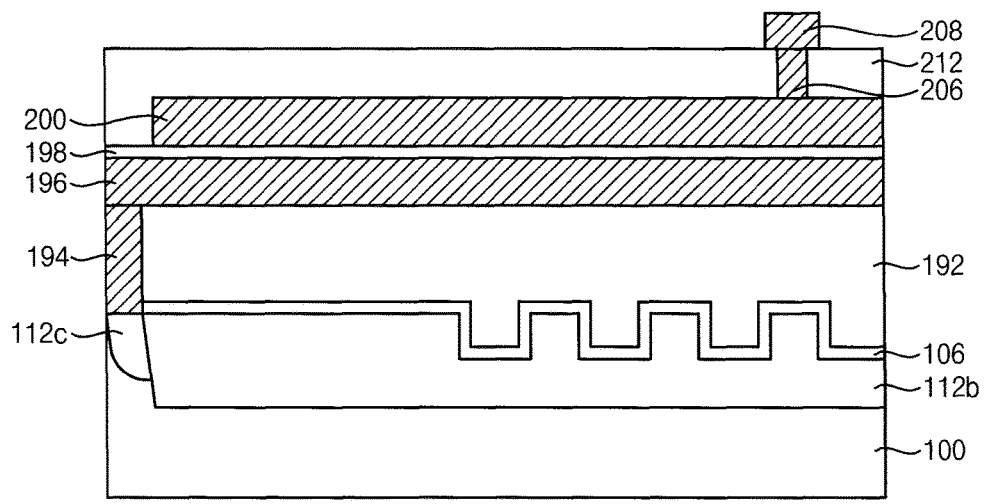
FIG. 18B is a cross-sectional view of the ESD protection device cut along a line B-B' in FIG. 17.
Figure 18C:
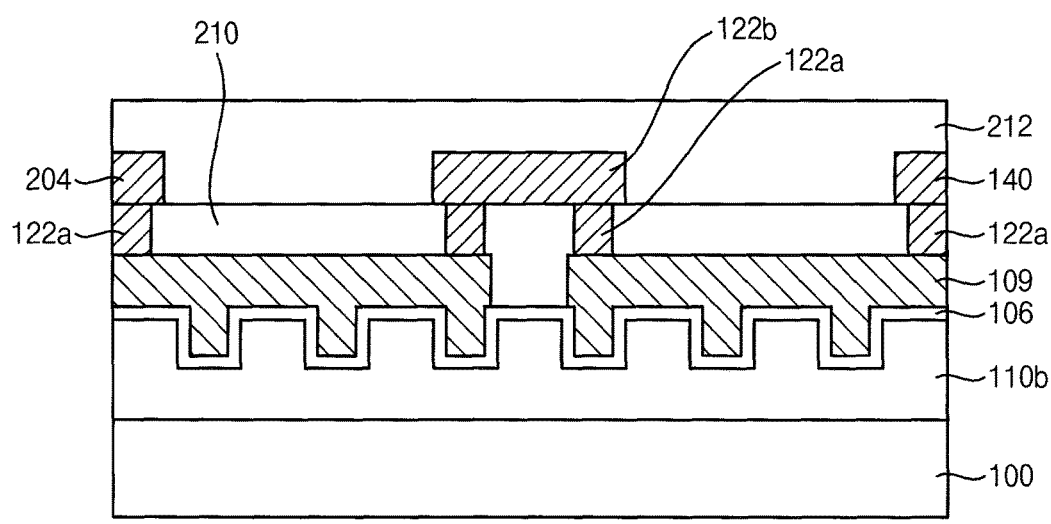

FIG. 15 is a top view illustrating an ESD protection device in accordance with at least one example embodiment. FIG. 16 is a cross-sectional view of the ESD protection device cut along a line A-A' in FIG. 15.

The ESD protection device in FIG. 15 may be substantially the same as or similar to that of FIG. 9 except for structures of an electrode pattern of a capacitor and a gate electrode of a NMOS transistor and a resistor. Thus, like reference numerals refer to like elements, and detailed descriptions thereon are omitted herein. In addition, cross-sectional views of the ESD protection device cut along lines B-B' and C-C' in FIG. 13 may be substantially the same as the cross-sectional views of FIGS. 10 and 3A, respectively.

Referring to FIGS. 15 and 16, a substrate may include an NMOS transistor region 100. The NMOS transistor region 100 may include a capacitor region and a resistor region thereon. The NMOS transistor region 100 may have a plurality of active fins 102 and a plurality of grooves 104 between the active fins 102.

The NMOS transistor region 100 may include a source 110 and a drain 112 of the NMOS transistor, and the source 110 and the drain 112 of the NMOS transistor may be arranged opposite to each other in a first direction. In at least one example embodiment, the drain 112 may be formed at a first side of the gate electrode 120b, and the source 110 may be formed at a second lower side of the gate electrode 120b. The second side of the gate electrode 120b may be arranged opposite to the first side of the gate electrode 120b in the first direction. A gate electrode 180b, a portion of an insulation layer 106 under the gate electrode 180b and a portion the substrate under the gate electrode 180b may serve as a channel region of the NMOS transistor. The source 110 may include a source extension region 110b, and first and second source regions 110a and 110b. The drain 112 may include a drain extension region 112b and a drain region 112c. N-type impurities may be implanted into region 100 to form the first and second source regions 110a and 110c and the first and second drain regions 112a and 112c, respectively. The source and drain extension region 110b and 112b may have a concentration of n-type impurities lower than those of the drain region 112c and the first and second source region 110a and 110b.

In at least one example embodiment, the drain 112 does not include an elevated drain region.

An insulation layer 106 may be conformally formed on the active fins 102 and the grooves 104. Portions of the insulation layer 106 may serve as a gate insulation layer of the NMOS transistor, a dielectric layer of the capacitor and an insulating interlayer 106, respectively, according to locations thereof.

An integrated electrode 180 may be formed on a portion of insulation layer 106 on the channel and drain region. The integrated electrode 180 may include a gate electrode 180b and an electrode pattern 180a, and the gate electrode 180b and the electrode pattern 180a may be integrally formed with no additional upper wirings. Thus, the integrated electrode 180 may have a rectangular flat shape. In other words, no additional wirings or connection regions are used.

The integrated electrode 180 may cover the channel region and the drain extension region 112b. A portion above the channel region of the integrated electrode 180 may serve as the gate electrode 180b. In addition, a portion above the drain extension region 112b in of integrated electrode 180 may serve as an upper electrode of a capacitor, and thus may also serve as the electrode pattern 180a.

The integrated electrode 180 may include a metal. The integrated electrode 180 may include a barrier layer pattern and a metal pattern, which may be sequentially stacked. Alternatively, the electrode pattern 120a may include a semiconductor material doped with impurities, e.g., doped polysilicon.

A resistor may be formed on a portion of the insulation layer 106 on the source extension region 110b. The resistor may include resistance line patterns 108c, first contacts 122a and connection patterns 122b. The resistor may have a structure substantially the same as or similar to that in FIG. 2.

The resistor may be electrically connected to the integrated electrode 180 via wirings. At least one of third contacts 152a may be formed on the integrated electrode 180. A second connection line 136a may be electrically connected to at least one of the third contacts 152a and the first contact 122a.

A first wiring may be electrically connected to the drain region 112c of the NMOS transistor. The first wiring may include second contacts 130a and a drain line 132. The second contacts 130a may contact the drain region 112c, and the drain line 132 may contact the second contacts 130a.

A second wiring may be electrically connected to the second source region 110c of the NMOS transistor. The second wiring may include fourth contacts 152b and a source line 138. The fourth contacts 152b may contact the second source region 110c, and the source line 138 may contact the fourth contact 152b. The source line 138 may be electrically connected to the resistor. 138. The first and second wirings may have a shape and a structure substantially the same as or similar to the shape and structure in FIG. 2.

Hereinafter, a method of manufacturing the ESD protection device in FIG. 15 will be illustrated.

In order to form the ESD protection device in FIG. 15, a process illustrated with reference to FIGS. 4 to 5 may be performed to form the ESD protection device in FIG. 5.

Then, an insulation layer 106 may be formed on a substrate, and a polysilicon layer may be formed on the insulation layer 106. The polysilicon layer may be patterned to form a preliminary integrated electrode and a resistance line pattern. The preliminary integrated electrode may have a structure substantially the same as or similar to that of the preliminary integrated electrode in FIG. 15. The preliminary integrated electrode may include a preliminary electrode pattern, a preliminary gate electrode and a preliminary connection region.

Then, as illustrated in FIG. 6, impurities may be implanted to form first and second source regions 110a and 110c and a drain region 112c, respectively. A first drain region in FIG. 6 may be covered by the preliminary integrated electrode during the doping process. Therefore, an elevated drain region is not formed, which may serve as the first drain region in FIG. 6.

Then, the process illustrated with reference to FIGS. 7 and 8 may be performed to form the ESD protection device in FIG. 15.

FIG. 17A is a cross-sectional view of the ESD protection device cut along a line A-A' in FIG. 16. FIG. 17B is a cross-sectional view of the ESD protection device cut along a line B-B' in FIG. 16. FIG. 17C is a cross-sectional view of the ESD protection device cut along a line C-C' in FIG. 16.

The ESD protection device in FIG. 17 may be substantially the same as or similar to that of FIG. 2 except for structures of an electrode pattern of a capacitor and a resistor. Thus, like reference numerals refer to like elements, and detailed descriptions thereon are omitted herein.

Referring to FIGS. 17 and 18A to 18C, a substrate may be formed may include an NMOS transistor region 100. The NMOS transistor region 100 may include a capacitor region and a resistor region thereon. The NMOS transistor in the ESD protection device may be a FinFET. Therefore, the NMOS transistor region 100 may have a plurality of active fins 102 and a plurality of grooves 104 between the active fins 102.

A first insulation layer 106 may be conformally formed on the active fins 102 and the grooves 104.

A gate electrode 190 may extend on the first insulation layer 106 to cross over the active fins 102. The gate electrode 190 may have a linear shape extending in a second direction perpendicular to the first direction. The gate electrode 190 may include a barrier layer pattern and a metal pattern, which may be sequentially stacked. Alternatively, the gate electrode 120b may include a semiconductor material doped with impurities, e.g., doped polysilicon.

The NMOS transistor region 100 may include a source 110 and a drain 112 of the NMOS transistor, and the source 110 and the drain 112 of the NMOS transistor may be arranged opposite to each other in a first direction substantially perpendicular to the second direction. The source 110 may include first source extension region 110b and first and second source regions 110a and 110c. The drain 112 may include drain extension region 112b and first and second source regions 112a and 112c. A region above the drain extension region 112b may serve as a capacitor region, and a region above the source extension region 110b may serve as a resistor region.

The resistor may be formed on the first insulation layer 106 on the source extension region 110b. The resistor may include a plurality of resistance line patterns 109, first contacts 112a and connection patterns 112b. The resistor may have a structure substantially the same as or similar to that of the resistor in FIG. 2.

A first insulating interlayer 192 may cover the gate electrode 190 and the resistor.

A connection structure may include second contacts 194 and a first electrode pattern 196. The connection structure may be electrically connected to the second drain region 112c of the NMOS transistor, and also serve as a lower electrode of the capacitor. The second contacts 194 may be electrically connected to the drain region through the first insulating interlayer 192. The second contacts 194 may be formed on a top surface of active fins 102. The first electrode pattern 196 may be electrically connected to the second contacts 194, which may be formed on the first insulating interlayer 192. The first electrode pattern 196 may cover a region above the drain extension region 112b. The first electrode pattern 196 may include a first metal. The first electrode pattern 196 may also serve as a drain line.

A dielectric layer 198 may cover a top surface of the first electrode pattern 196. A second electrode pattern 200 may be formed on the dielectric layer 198. The second electrode pattern 220 may include a second metal. The second metal may be substantially the same as or similar to the first metal. Alternatively, the second metal may be different from the second metal. Thus, the first electrode pattern 196, the dielectric layer 198 and the second electrode pattern 200 may serve as a MIM capacitor.

The gate electrode 190 may be electrically connected to the resistor. The gate electrode 190 may include third contacts 202 and first connection lines. The third contacts 202 may be electrically connected to the gate electrode 190, and a second connection line 204 may be electrically connected to first contacts 204. The first contacts 204 may contact the resistor. The second connection line 204 may include the first metal, which may serve as a first metal wiring.

The second electrode pattern 200 may be electrically connected to the gate electrode 190. In other words, the second electrode pattern 200 may be electrically connected to the gate electrode 190 via fourth contacts 206 and a fourth connection line 208. The fourth contacts 206 may contact each of the second electrode pattern 200 and the second contacts 202. The fourth contacts 206 may be electrically connected to each other via the fourth connection line 208.

A source wiring may be electrically connected to the second source region 110c of the NMOS transistor. The source wiring line may include a contact 130d contacting the second source region 110c and a source line 138 contacting the contact 130d. The source line 138 may be electrically connected to the resistor. The source wiring may have a structure substantially the same as or similar to that of the source wiring in FIG. 2.

Hereinafter, a method of manufacturing the ESD protection device in FIG. 17 will be illustrated.

In order to form the ESD protection device in FIG. 17, a process illustrated with reference to FIGS. 4 to 5 may be performed to form a structure of the ESD protection device in FIG. 5.

Then, an insulation layer 106 may be formed on a substrate, and a polysilicon layer may be formed on the insulation layer 106. The polysilicon layer may be patterned to form a preliminary gate electrode and a resistance line pattern 109. An electrode pattern or a preliminary electrode pattern of a transistor does not have to be formed through the etch process.

Then, as illustrated in FIG. 6, impurities may be implanted into the substrate to form first and second source regions 110a and 110c and first and drain regions 112a and 112c. Then, the process illustrated with reference to FIGS. 7 and 8 may be performed.

Referring to FIG. 17, a first electrode pattern 196 may be integrally formed with a drain line during a process for forming wirings in FIG. 8.

A dielectric layer 198 may be formed to cover a top surface of the first electrode pattern 196. A second electrode pattern 200 may be formed on the dielectric layer 198.

An insulating interlayer 212 may be formed to cover the second electrode pattern 200, and a plurality of wirings 206 and 208 may be formed to be electrically connected to the second electrode pattern 200 and a gate electrode 190.

An ESD protection device in FIG. 17 may be formed by performing the processes.

At least one example embodiment may be used for various types of semiconductor devices including an ESD protection device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concepts. Accordingly, all such modifications are intended to be included within the scope of the inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An electrostatic discharge (ESD) protection device, comprising:
    a substrate;
    a plurality of fins disposed on the substrate, each of the plurality of fins extending in a first direction;
    an insulation layer disposed on the plurality of fins;
    a gate electrode disposed on the insulation layer, and extending in a second direction that is perpendicular to the first direction;
    a drain disposed at a first side of the gate electrode;
    a source disposed at a second side of the gate electrode;
    an electrode pattern of a capacitor disposed on the insulation layer, and connected to one of the drain and the source;
    a resistor disposed on the insulation layer, and connected to the other of the drain and the source; and
    a connection structure electrically connected to the electrode pattern of the capacitor, the gate electrode and the resistor,
    wherein the electrode pattern of the capacitor is disposed at one of the first side and the second side of the gate electrode,
    the resistor is disposed at the other of the first side and the second side of the gate electrode, and
    at least a portion of the resistor is extending in the second direction.

2. The ESD protection device of claim 1, further comprising a plurality of grooves disposed on the substrate, each of the plurality of grooves extending in the first direction.

3. The ESD protection device of claim 1, wherein the resistor includes doped polysilicon.

4. The ESD protection device of claim 1, wherein the resistor comprises:
    a plurality of resistance line patterns extending in the second direction;
    a plurality of contacts contacting the plurality of resistance line patterns; and
    a plurality of connection patterns contacting the plurality of contacts,
    wherein each of the plurality of connection patterns electrically connects two contacts among the plurality of contacts.

5. The ESD protection device of claim 1, wherein an upper portion of the source and an upper portion of the drain are doped with n-type impurities.

6. A device, comprising:
    a substrate;
    a transistor structure on the substrate, the transistor structure including a source region, a drain region, and a gate region between the source region and the drain region, the gate region including a gate electrode on an insulating layer;
    a capacitive structure on the substrate, the capacitive structure including an electrode pattern aligned with the drain region;
    a resistive structure on the substrate, the resistive structure being aligned with the source region; and
    a connection structure electrically connecting the transistor structure, the capacitive structure, and the resistive structure to one another,
    wherein the capacitive structure comprises the electrode pattern as a first electrode of the capacitive structure and the drain region as a second electrode of the capacitive structure.

7. The device of claim 6, wherein each of the drain region and the source region includes a first impurity region between a second impurity region and a third impurity region, the first impurity region having a lower impurity concentration than the second impurity region and the third impurity region.

8. The device of claim 7, wherein the capacitive structure further includes the first impurity region of the drain region and the insulating layer, the electrode pattern being aligned with the first impurity region of the drain region.

9. The device of claim 8, wherein the resistive structure includes one or more line patterns aligned with the first impurity region of the source region.

10. The device of claim 9, wherein top surfaces of the electrode pattern, the one or more line patterns, and the gate electrode are coplanar with one another and are formed of a substantially same material.

11. The device of claim 6, wherein the transistor structure comprises a plurality of active fins and a first plurality of grooves, each of the active fins and each of the grooves extending in a first direction.

12. The device of claim 11, wherein a bottom surface of the electrode pattern of the capacitive structure includes protrusion and groove portions corresponding to the active fins and the first plurality of grooves of the transistor structure.

13. The device of claim 11, wherein a bottom surface of the resistive structure includes a second plurality of grooves extending in the first direction.

14. A device, comprising:
a substrate;
a transistor structure on the substrate, the transistor structure including a source region, a drain region, and a gate region between the source region and the drain region, the gate region including a gate electrode on an insulating layer;
a capacitive structure on the substrate, the capacitive structure including an electrode pattern disposed on the drain region;
a resistive structure on the substrate, the resistive structure being disposed on the source region; and
a connection structure electrically connecting the transistor structure, the capacitive structure, and the resistive structure to one another,
wherein top surfaces of the gate electrode, the electrode pattern of the capacitor, and the resistor are coplanar with each other,
wherein the transistor structure comprises a plurality of active fins and a plurality of grooves, each of the active fins and each of the grooves extending in a first direction.

15. The device of claim 14, wherein each of the drain region and the source region includes a first impurity region between a second impurity region and a third impurity region, the first impurity region having a lower impurity concentration than the second impurity region and the third impurity region.

16. The device of claim 15, wherein the capacitive structure further includes the first impurity region of the drain region and the insulating layer, the electrode pattern being aligned with the first impurity region of the drain region.

17. The device of claim 16, wherein the resistive structure includes one or more line patterns aligned with the first impurity region of the source region.

18. The device of claim 14, wherein a bottom surface of the electrode pattern of the capacitive structure includes protrusion and groove portions corresponding to the active fins and the grooves of the transistor structure.

19. The device of claim 14, wherein a bottom surface of the resistive structure includes a plurality of grooves extending in the first direction.

* * * * *